(12) United States Patent
Musashi et al.

(10) Patent No.: US 11,923,488 B2
(45) Date of Patent: Mar. 5, 2024

(54) LIGHT EMITTING DEVICE INCLUDING LIGHT TRANSMISSIVE MEMBER WITH CONCAVE PORTIONS

(71) Applicant: NICHIA CORPORATION, Anan (JP)

(72) Inventors: Naoki Musashi, Anan (JP); Takayoshi Wakaki, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/351,928

(22) Filed: Jun. 18, 2021

(65) Prior Publication Data

US 2021/0313495 A1 Oct. 7, 2021

Related U.S. Application Data

(62) Division of application No. 16/282,286, filed on Feb. 21, 2019, now Pat. No. 11,088,305.

(30) Foreign Application Priority Data

Feb. 22, 2018 (JP) ................................. 2018-029512

(51) Int. Cl.
*H01L 33/58* (2010.01)
*H01L 33/54* (2010.01)
(Continued)

(52) U.S. Cl.
CPC .............. *H01L 33/58* (2013.01); *H01L 33/54* (2013.01); *H01L 33/56* (2013.01); *H01L 25/0753* (2013.01); *H01L 33/44* (2013.01); *H01L 33/486* (2013.01); *H01L 33/505* (2013.01); *H01L 33/62* (2013.01); *H01L 2933/0033* (2013.01); *H01L 2933/0041* (2013.01);
(Continued)

(58) Field of Classification Search
CPC ......... H01L 33/58; H01L 33/54; H01L 33/56; H01L 51/5262; H01L 51/5268
See application file for complete search history.

(56) References Cited

U.S. PATENT DOCUMENTS 7,955,531 B1 * 6/2011 Khanarian ............ H01L 51/524
156/60
2003/0151361 A1 8/2003 Ishizaka
(Continued)

FOREIGN PATENT DOCUMENTS

| JP | 2003-234509 A | 8/2003 |
| JP | 2007-036030 A | 2/2007 |

(Continued)

OTHER PUBLICATIONS

Non-Final Office Action on U.S. Appl. No. 16/282,286 dated Dec. 4, 2020.
(Continued)

*Primary Examiner* — Peter Bradford
(74) *Attorney, Agent, or Firm* — Foley & Lardner LLP

(57) ABSTRACT

A light emitting device includes: a light emitting element having a top surface; and a light-transmissive member covering at least the top surface of the light emitting element, the light-transmissive member having a principal surface located above the top surface of the light emitting element. The principal surface of the light-transmissive member comprises a plurality of concave portions.

8 Claims, 27 Drawing Sheets

(51) Int. Cl.
  *H01L 33/56* (2010.01)
  *H01L 25/075* (2006.01)
  *H01L 33/44* (2010.01)
  *H01L 33/48* (2010.01)
  *H01L 33/50* (2010.01)
  *H01L 33/62* (2010.01)

(52) U.S. Cl.
  CPC .......... *H01L 2933/005* (2013.01); *H01L 2933/0058* (2013.01); *H01L 2933/0083* (2013.01); *H01L 2933/0091* (2013.01)

(56) References Cited

U.S. PATENT DOCUMENTS

| | | |
|---|---|---|
| 2005/0141240 A1 | 6/2005 | Hata et al. |
| 2005/0224830 A1* | 10/2005 | Blonder ............... H01L 33/507 257/E25.02 |
| 2008/0224160 A1* | 9/2008 | Chang .................... H01L 33/58 257/E33.072 |
| 2009/0250718 A1 | 10/2009 | Chang |
| 2010/0209670 A1 | 8/2010 | Suehiro et al. |
| 2011/0155999 A1* | 6/2011 | Tansu ..................... H01L 33/22 257/E33.025 |
| 2011/0169027 A1 | 7/2011 | Park et al. |
| 2011/0318863 A1 | 12/2011 | Tu et al. |
| 2012/0043573 A1* | 2/2012 | Mitsuishi ......... C09K 11/77348 257/E33.056 |
| 2012/0217472 A1 | 8/2012 | Tansu et al. |
| 2013/0186467 A1 | 7/2013 | Saeki et al. |
| 2013/0341671 A1 | 12/2013 | Ona et al. |
| 2014/0305904 A1 | 10/2014 | Lan |
| 2016/0041312 A1 | 2/2016 | Morinaka et al. |
| 2017/0179344 A1 | 6/2017 | Matsuda |
| 2017/0294563 A1 | 10/2017 | Hashimoto |
| 2019/0051800 A1 | 2/2019 | Lin et al. |

FOREIGN PATENT DOCUMENTS

| | | |
|---|---|---|
| JP | 2011-003870 A | 1/2011 |
| JP | 2014-005324 A | 1/2014 |
| JP | 2014-175416 A | 9/2014 |
| JP | 2016-001639 A | 1/2016 |
| JP | 2016-092139 A | 5/2016 |
| JP | 2017-032806 A | 2/2017 |
| JP | 2017-118098 A | 6/2017 |
| JP | 2017-188593 A | 10/2017 |
| JP | 2018006540 A * | 1/2018 |
| WO | WO-2017/080461 A1 | 5/2017 |

OTHER PUBLICATIONS

Notice of Allowance on U.S. Appl. No. 16/282,286 dated Mar. 29, 2021.

* cited by examiner

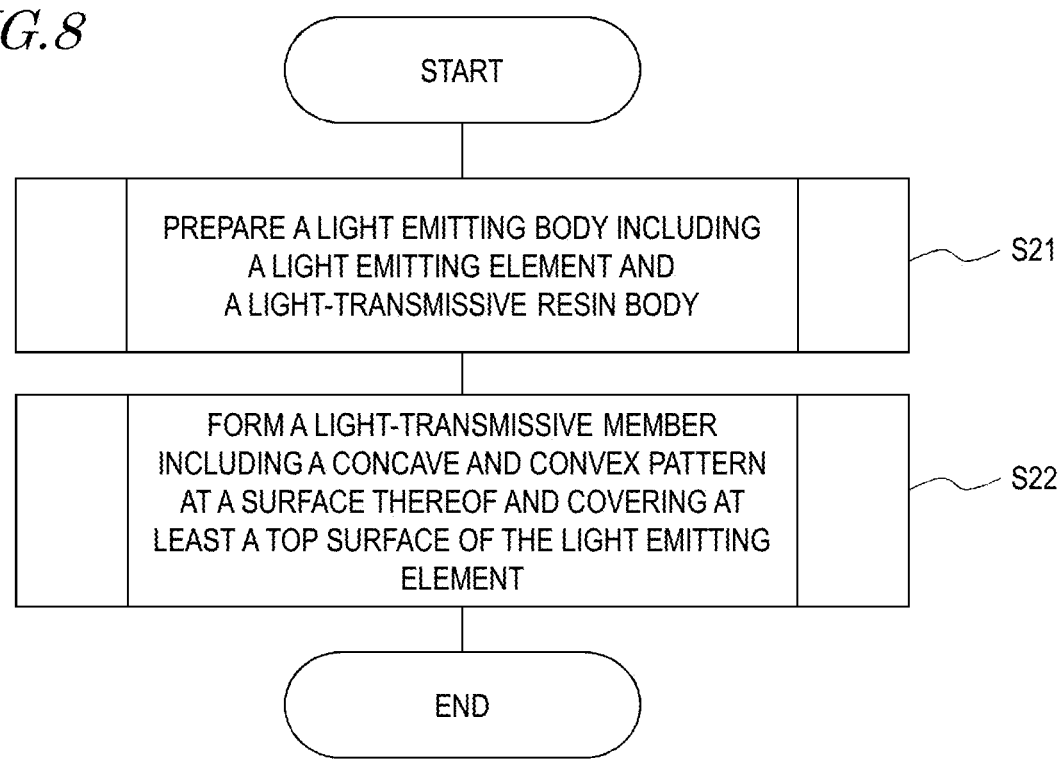
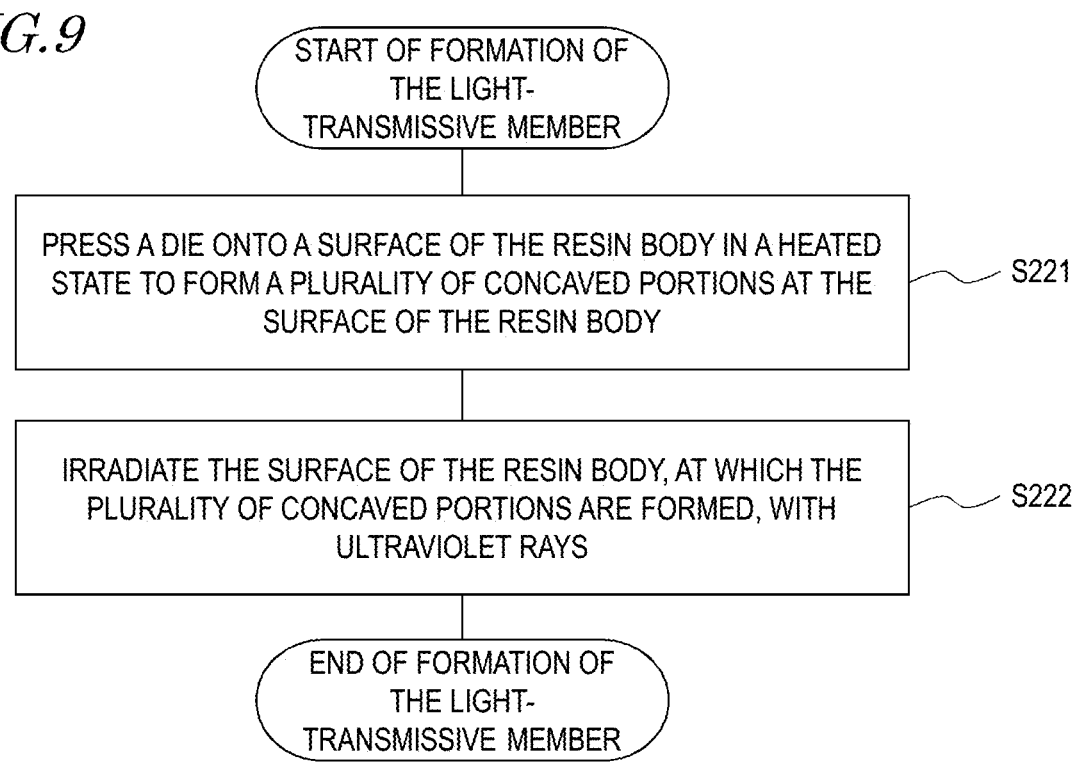

LIGHT EMITTING DEVICE INCLUDING LIGHT TRANSMISSIVE MEMBER WITH CONCAVE PORTIONS

CROSS-REFERENCE TO RELATED APPLICATIONS

This application is a divisional of U.S. patent application Ser. No. 16/282,286, filed on Feb. 21, 2019, which claims priority to Japanese Patent Application No. 2018-029512, filed on Feb. 22, 2018, the disclosures of which are hereby incorporated by reference in their entireties.

BACKGROUND

The present disclosure relates to a method for forming a light-transmissive member, a method for producing a light emitting device, and a light emitting device.

As a technology for forming a microscopic concave and convex pattern, an imprint method of transferring a surface shape of a die having a microscopic concave and convex pattern to a layer formed of a resin material is known. The target to which such a shape is transferred by the imprint method is formed of a thermoplastic resin or an ultraviolet-curable resin. In the case of the former, the die is pressed onto a thermoplastic resin target, the thermoplastic resin target is heated to be cured, and the thermoplastic resin target is separated from the die. In the case of the latter, a die that transmits ultraviolet rays is pressed onto an ultraviolet-curable resin target, the ultraviolet-curable resin target is irradiated with ultraviolet rays through the die to be cured, and the ultraviolet-curable resin target is separated from the die.

As disclosed in Japanese Laid-Open Patent Publication No. 2017-032806, the imprint method is used to, for example, form an antireflection film for a display device. The imprint method is also used to produce a thin film polarizer or the like. The imprint method is used to form a resist pattern used for etching. Japanese Patent Publication No. 2016-001639 describes that the imprint method is usable to form a mask used to form a frustum, conical or pyramid shape at a surface of a semiconductor stack body including an n-type semiconductor layer and a p-type semiconductor layer. The imprint method is expected to be used to form a concave and convex pattern in order to improve the light extraction efficiency in a light emitting element such as a light emitting diode (LED) or the like, an organic EL light emitting device and the like.

SUMMARY

With the imprint method, a microscopic concave and convex pattern is formed. However, the target at which such a pattern may be formed is currently limited to a thermoplastic resin or an ultraviolet-curable resin in an uncured state.

In one general aspect, a method for forming a light-transmissive member disclosed herein comprises a step (A) of locating a cured resin body having a principal surface and containing a silicone resin, and a die including a plurality of convex portions, such that the principal surface and the plurality of convex portions face each other, and pressing the die onto the principal surface of the resin body in a heated state to form a plurality of concave portions at the principal surface; and a step (B) of, after the step (A), irradiating the principal surface of the resin body with ultraviolet rays.

In one embodiment of the present disclosure, a method for producing a light emitting device comprises a step (a) of preparing a light emitting body including a light emitting element having a top surface and a light-transmissive resin body covering at least the top surface of the light emitting element; and a step (b) of forming a light-transmissive member including a concave and convex pattern at a surface thereof and covering at least the top surface of the light emitting element. The step (b) includes a step (b1) of locating a die including a plurality of convex portions such that the plurality of convex portions face a surface of the resin body, and pressing the die onto the surface of the resin body in a heated state to form a plurality of concave portions at the surface; and a step (b2) of, after the step (b1), irradiating the surface of the resin body with ultraviolet rays.

In another embodiment of the present disclosure, a method for producing a light emitting device comprises a step (a) of preparing a light emitting element having a top surface and including a positive electrode and a negative electrode at the opposite side of the top surface; and a step (b) of forming a light-transmissive member including a concave and convex pattern at a surface thereof and covering at least the top surface of the light emitting element. The step (b) includes a step (b1) of locating a die including a plurality of convex portions such that the plurality of convex portions face a surface of a light-transmissive resin body formed by curing an uncured silicone resin starting material, and pressing the die onto the surface of the resin body in a heated state to form a plurality of concave portions at the surface; and a step (b2) of, after the step (b1), irradiating the surface of the resin body with ultraviolet rays.

In another embodiment of the present disclosure, a method for producing a light emitting device comprises a step (a) of preparing a light emitting element having a top surface and including a positive electrode and a negative electrode at the opposite side of the top surface; and a step (b) of forming a light-transmissive member including a concave and convex pattern at a surface thereof and covering at least the top surface of the light emitting element. The step (b) includes a step (b1) of locating a die including a plurality of convex portions such that the plurality of convex portions face a principal surface of a light-transmissive sheet formed by curing an uncured silicone resin starting material, and pressing the die onto the principal surface of the light-transmissive sheet in a heated state to form a plurality of concave portions at the principal surface; a step (b2) of, after the step (b1), irradiating the principal surface of the light-transmissive sheet with ultraviolet rays; and a step (b3) of locating the light-transmissive sheet irradiated with the ultraviolet rays on the side of the top surface of the light emitting element.

In another embodiment of the present disclosure, a light emitting device comprises a light emitting element having a top surface; and a light-transmissive member covering at least the top surface of the light emitting element, and having a principal surface located above the top surface of the light emitting element. The principal surface of the light-transmissive member includes a plurality of concave portions. An absorption, derived from Si—OH, appearing in an absorption spectrum by the light-transmissive member, in a wave number range greater than 3700 $cm^{-1}$ and less than 3000 $cm^{-1}$ is larger than an absorption in the wave number range of an absorption spectrum by a silicone resin; and absorption peaks, derived from by Si—$CH_3$, appearing in the absorption spectrum by the light-transmissive member, at a wave number of 2960 $cm^{-1}$ or in the vicinity thereof and at a wave number of 800 $cm^{-1}$ or in the vicinity thereof are respectively lower than absorption peaks appearing in the absorption spectrum by the silicone resin, at a wave number of 2960 cm$^{-1}$ or in the vicinity thereof and at a wave number of 800 cm$^{-1}$ or in the vicinity thereof, the absorption spectra being obtained by infrared spectroscopy.

In another embodiment of the present disclosure, a light emitting device comprises a light emitting element having a top surface; and a light-transmissive member covering at least the top surface of the light emitting element, and having a principal surface located above the top surface of the light emitting element. The principal surface of the light-transmissive member includes a plurality of concave portions; and a tacky property of the principal surface of the light-transmissive member is lower than a tacky property of a silicone resin.

In another embodiment of the present disclosure, a light emitting device comprises a light emitting element having a top surface; and a light-transmissive member covering at least the top surface of the light emitting element, and having a principal surface located above the top surface of the light emitting element. The principal surface of the light-transmissive member includes a plurality of concave portions; and the plurality of concave portions have a depth changed by 25% or less after being heated at a temperature of 300° C. for 40 minutes.

According to the above aspects, novel methods for forming a microscopic concave and convex pattern are provided.

BRIEF DESCRIPTION OF THE DRAWINGS

FIG. 8 is a flowchart showing an example of method for producing the light emitting device in Embodiment 2 according to the present disclosure.

FIG. 9 is a flowchart showing steps that may be included in step S22 shown in FIG. 8.

DETAILED DESCRIPTION

Figure 1:
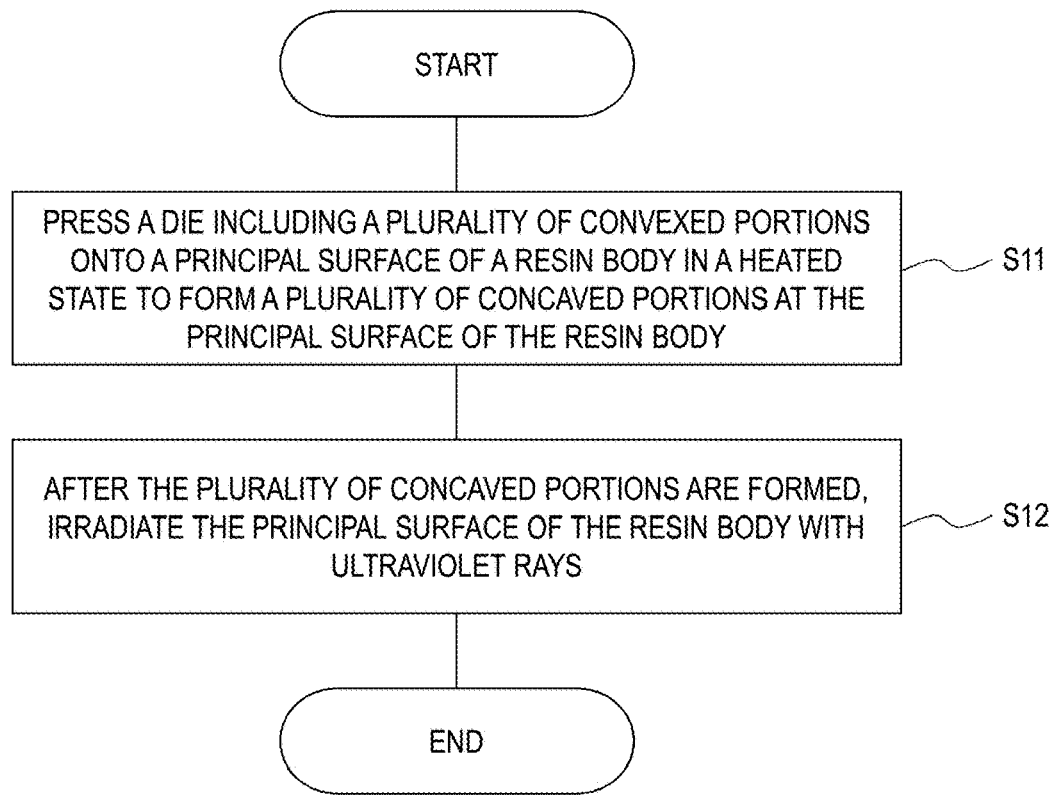
FIG. 1 is a flowchart showing an overview of a method for forming a light-transmissive member in Embodiment 1 according to the present disclosure.

Hereinafter, embodiments of the present disclosure will be described in detail with reference to the attached drawings. The following embodiments are illustrative, and the method for forming a light-transmissive member and the method for producing a light emitting device according to the present disclosure are not limited to any of the following embodiments. For example, the numerical values, shapes, materials, steps, the order of the steps, and the like shown in the embodiments are merely examples, and may be modified in various manners as long as no technological contradiction occurs.

In the drawings, the sizes, shapes and the like of the components may be emphasized for clear illustration, and may not reflect the sizes, shapes and size relationship of components of the actual light-transmissive member, light emitting device and production device. Some of the components may be omitted in order to avoid the drawings from being excessively complicated.

In the following description, components having substantially the same functions will be represented by the same reference numeral, and the descriptions thereof may be omitted. In the following description, terms showing specific directions or positions (e.g., "top", "above", "bottom", "right", "left" and terms including these terms) may be used. These terms are merely used to show relative directions or positions in referenced drawing, for easier understanding. The components merely need to be arranged in the directional and positional relationship as described by use of the terms "top", "below", "bottom" and the like with reference to a drawing in the present disclosure. In any drawing other than those in the present disclosure, an actual product, an actual production device or the like, the components do not need to be located as exactly shown in a drawing in the present disclosure. In the present disclosure, the term "parallel" encompasses a case where two straight lines, sides, planes or the like make an angle in the range of approximately 0°±5° unless otherwise specified. In the present disclosure, the terms "vertical" and "perpendicular" encompass a case where two straight lines, sides, planes or the make an angle in the range of approximately 90°±5° unless otherwise specified.

Embodiment 1

FIG. 1 is a flowchart showing an overview of a method for forming a light-transmissive member in Embodiment 1 according to the present disclosure. The method for forming the light-transmissive member shown in FIG. 1 generally includes a step of pressing a die including a plurality of convex portions onto a main surface of a resin body in a heated state to form a plurality of concave portions at the principal surface of the resin body (step S11) and a step of, after the plurality of concave portions are formed, irradiating the principal surface of the resin body with ultraviolet rays (step S12).

As described above, according to the imprint method, which is one technique for forming a microscopic concave and convex pattern, a thermoplastic resin or an ultraviolet-curable resin in an uncured state is used as a target onto which the die is to be pressed. By contrast, in an embodiment according to the present disclosure, the die is pressed onto a resin body containing a silicone resin, which is a thermosetting resin, specifically, a resin body in a cured state. It has not conventionally been conceived to press the die onto a resin in a cured state instead of a resin in an uncured state and to irradiate the thermosetting resin with ultraviolet rays. In an embodiment according to the present disclosure, for example, a plurality of concave portions are formed in a cured resin body containing a silicone resin by use of a die, and then the resin body is irradiated with ultraviolet rays. In this manner, the shape obtained as a result of the die being pressed is fixed. In such an embodiment according to the present disclosure, a microscopic concave and convex pattern, for example, can be conferred to a surface of a cured thermosetting resin body.

Hereinafter, a method for forming a light-transmissive member according to this embodiment will be described in detail with reference to the drawings.

Figure 2:
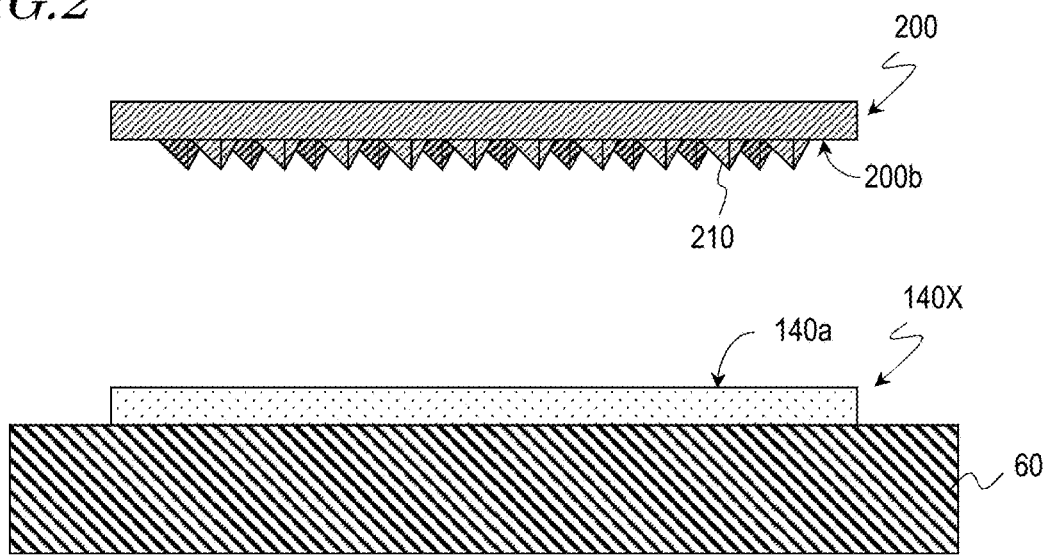
FIG. 2 is a schematic cross-sectional view showing an illustrative method for forming the light-transmissive member in Embodiment 1 according to the present disclosure.

First, as shown in FIG. 2, a resin body 140X is prepared. In the example shown in FIG. 2, the resin body 140X is generally plate-like, and has a flat principal surface 140a. The resin body 140X is a plate-like member in this example. Alternatively, the resin body 140X may have any shape. The principal surface 140a, which is a top surface of the resin body 140X in FIG. 2, is not limited to being flat, and may be curved.

The resin body 140X is light-transmissive, and after being provided with a concave and convex pattern, may be arranged on the light output side of a light emitting element, a light emitting device or the like as an optical member such as a protective member, a light diffusion member or the like. In this specification, the terms "light-transmissive" and "light transmission" are also interpreted as being capable of diffusing incident light, and is not limited to being "transparent".

The resin body 140X contains a silicone resin, and is in a cured state. The silicone resin in the resin body 140X contains an organic polysiloxane including at least one phenyl group in a molecule. Alternatively, the silicone resin in the resin body 140X contains an organic polysiloxane including a D unit, in which two methyl groups are bonded with a silicon atom. The resin body 140X may contains these two types of organic polysiloxane. The silicone resin in the resin body 140X may contain, for example, an organic polysiloxane including a phenyl group and also a D unit. The silicone resin composition used to form the resin body 140X may contain modified silicone having a group other than a methyl group or a phenyl group introduced thereto.

The resin body 140X is not limited to being substantially formed of a silicone resin, and may be a composite material containing a material other than the silicone resin. For example, the resin body 140X may include a silicone resin-containing material as a matrix and also include a light-reflective filler dispersed therein. The light-reflective filler may be formed of particles of an inorganic material or an organic material having a refractive index higher than a refractive index of the matrix. Examples of the light-reflective filler include particles of titanium dioxide, zirconium dioxide, potassium titanate, aluminum oxide, aluminum nitride, boron nitride, mullite, niobium oxide, barium sulfate, silicon oxide, various types of rare-earth oxides (e.g., yttrium oxide, gadolinium oxide, etc.), and the like. The matrix of the resin body 140X may contain a resin other than a silicone resin.

The resin body 140X may include a wavelength converting member dispersed in the resin. In the case of including a wavelength converting member, the resin body 140X absorbs at least a part of incident light and emits light having a wavelength different from a wavelength of the incident light. The wavelength converting member may be formed of particles of a phosphor or the like. The phosphor may be a known material. Examples of the phosphor include a YAG-based phosphor; fluoride-based phosphors such as a KSF-based phosphor and the like; nitride-based phosphors such as CASN and the like; a β-SiAlON phosphor; and the like. The YAG-based phosphor is an example of wavelength converting substance that converts blue light into yellow light. The KSF-based phosphor and CASN are examples of wavelength converting substance that converts blue light into red light. The β-SiAlON phosphor is an example of wavelength converting substance that converts blue light into green light. The phosphor may be a quantum dot phosphor.

The resin body 140X may be purchased or formed. The resin body 140X may be formed as follows, for example. A silicone resin starting material containing a silicone resin is put on a support plate such as a substrate or the like by coating such as spraying, casting, potting or the like or by screen printing, and then the resin starting material on the support plate is cured to form the resin body 140X. Alternatively, the resin body 140X may be formed by transfer molding, compression molding or the like.

Next, a die including a concave and convex pattern at a surface thereof is prepared. In this example, as shown in FIG. 2, a die 200 including a plurality of convex portions 210 is used. There is no specific limitation on the material of the die 200. The die 200 may be formed of, for example, a generally used material such as hardened steel, aluminum, beryllium copper alloy or the like.

Figure 3:
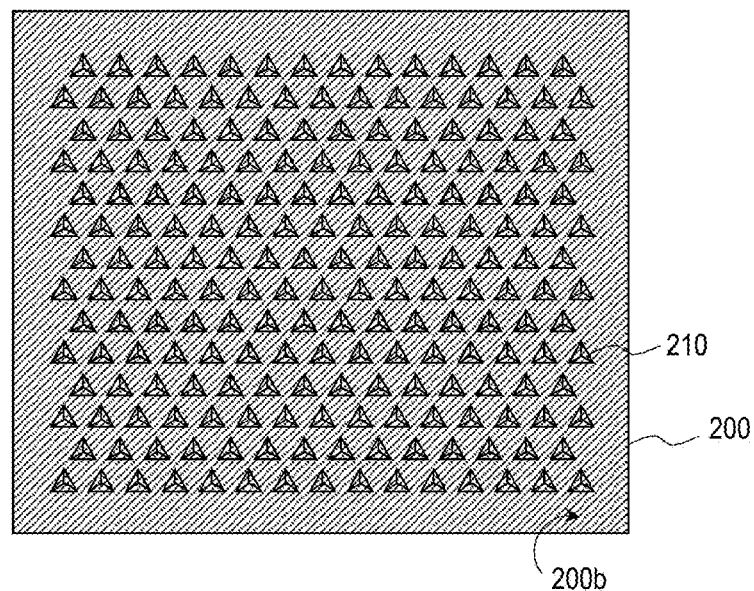
FIG. 3 is a schematic plan view showing an example of positional arrangement of convex portions.

In the structure shown in FIG. 2, the convex portions 210 are each a triangular pyramid-shaped protrusion that protrudes from a bottom surface 200b of the die 200. FIG. 3 shows an example of positional arrangement of the convex portions 210. In this example, the plurality of convex portions 210 are arrayed two-dimensionally on the bottom surface 200b of the die 200 such that apexes of the convex portions 210 are located at lattice points of a triangular lattice. The pitch of the convex portions 210, namely, the distance between the centers of two convex portions 210 adjacent each other, is, for example, in the range of 0.1 μm or larger and 300 μm or smaller. The height of the convex portions 210, namely, the distance from the bottom surface 200b to the apex of each of the convex portions 210, is, for example, in the range of 0.1 μm or larger and 200 μm or smaller. Needless to say, neither the positional arrangement nor the shape of the convex portions 210 is limited to the example shown in FIG. 2 or FIG. 3. The convex portions 210 may be arranged in any way and may have any shape.

Figure 4:
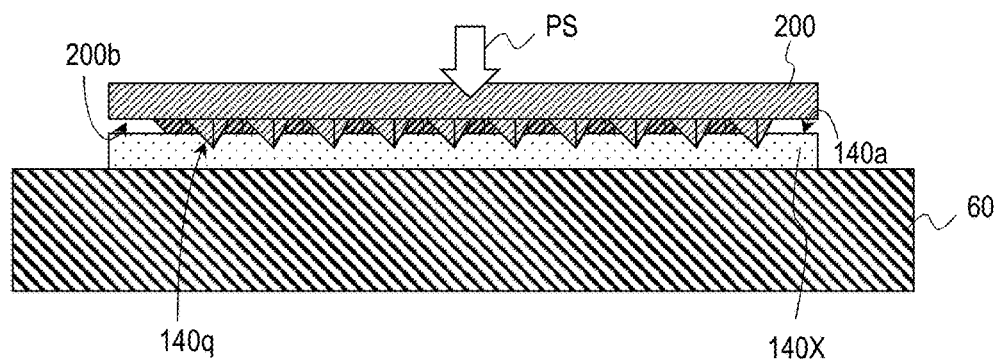
FIG. 4 is a schematic cross-sectional view showing the illustrative method for forming the light-transmissive member in Embodiment 1 according to the present disclosure.

Next, as schematically shown in FIG. 2, the resin body 140X is located on a support body 60 having a sufficient rigidity, and the die 200 is located to face the resin body 140X such that the convex portions 210 are directed toward the principal surface 140a of the resin body 140X. As schematically shown with the thick arrow PS in FIG. 4, the die 200 is pressed onto the principal surface 140a of the resin body 140X. At this point, the die 200 is pressed at a pressure of about 50 kPa to about 50 MPa onto the resin body 140X in a state of being heated to about 70° C. to about 300° C. As a result, a plurality of concave portions 140q corresponding to the plurality of convex portions 210 of the die 200 are formed at the principal surface 140a of the resin body 140X (step S11 in FIG. 1). The resin body 140X may be heated by raising the temperature around the resin body 140X or by raising the temperature of the die 200 and/or the support body 60.

Figure 5:
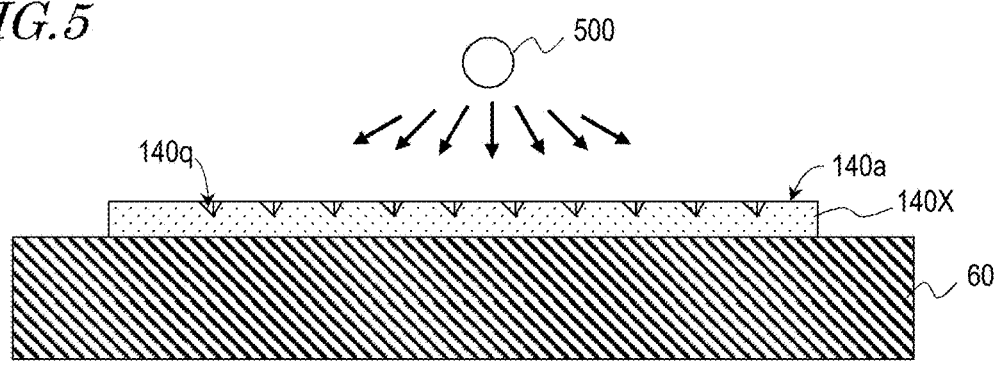
FIG. 5 is a schematic cross-sectional view showing the illustrative method for forming the light-transmissive member in Embodiment 1 according to the present disclosure.

Next, as schematically shown in FIG. 5, the principal surface 140a of the resin body 140X is irradiated with ultraviolet rays by use of an ultraviolet ray irradiation device 500 (step S12 in FIG. 1). The amount of irradiation with the ultraviolet rays is, for example, 20 J/cm$^2$ or greater. There is no specific limitation on the wavelength of the ultraviolet rays directed toward the resin body 140X. The ultraviolet ray irradiation device 500 may emit ultraviolet rays having a spectrum in the wavelength range of, for example, UVA (400 to 315 nm) to UVC (280 to 140 nm). In this example, a light source that emits light having a main peak emission wavelength of 365 nm is used. In the case where the die 200 is formed of a light-transmissive material such as quartz or the like, ultraviolet rays may be directed toward the resin body 140X through the die 200.

Figure 6:
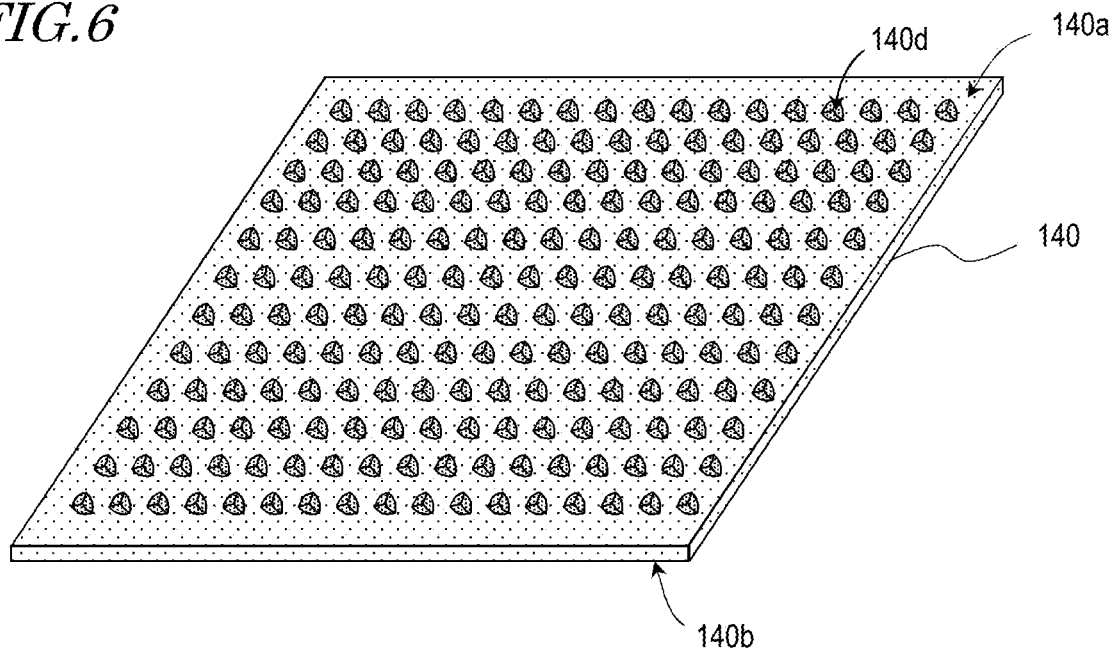
FIG. 6 is an perspective view showing an example of light-transmissive member.

As a result of the above-described steps, as shown in FIG. 6, a light-transmissive member 140 including a plurality of concave portions 140d at the principal surface 140a is formed. In FIG. 6, the concave portions 140d are shown larger than the actual size thereof, for the sake of convenience.

In this example, the convex portions 210 of the die 200 are arrayed such that the apexes thereof are located at the lattice points of the triangular lattice, and correspondingly, the concave portions 140d have centers thereof at the lattice points of the triangular lattice. The distance of each of the concave portions 140d from the opening to the bottom along the direction normal to the principal surface 140a, namely, the depth of the concave portions 140d, may be 0.9 µm or greater. As described below by way of examples, the shape of the concave portions 140d may be different from the shape of the concave portions 140q as a result of the irradiation with the ultraviolet rays.

The light-transmissive member 140 may have a light transmittance of 60% or higher with respect to light having a peak emission wavelength of a light emitting element such as an LED or the like, or a light emitting device, that may be located on the principal surface 140a side of the light-transmissive member 140 or located on a principal surface 140b side that is opposite to the principal surface 140a (in this example, the principal surface 140b is a bottom surface of the light-transmissive member 140). The light transmittance of the light-transmissive member 140 with respect to the light having the above-described peak emission wavelength is advantageously 70% or higher, and more advantageously 80% or higher. The light-transmissive member 140 may have a haze value of 50% or higher. The haze value may be measured by a measurement method conformed to JIS K7136:2000.

In an embodiment according to the present disclosure, the surface of the cured resin body may be provided with a shape. As described above with reference to FIG. 4, the convex portions 210 of the die 200 may be pressed onto the principal surface 140a of the resin body 140X in a heated state, so that the plurality of concave portions 140q are formed at the principal surface 140a. In other words, the plurality of concave portions 140q can be formed at the principal surface 140a even without the step of the irradiation with the ultraviolet rays. Namely, at first glance, it appears that the light-transmissive member including the plurality of concave portions at the principal surface thereof can be formed even if the step of irradiation with ultraviolet rays is omitted. However, as described below by way of examples, in the case where the step of irradiation with ultraviolet rays is omitted, if the resin body 140X is put into a high temperature environment of about 300° C. after the die 200 is pressed onto the resin body 140X, the shape of the concave portions 140q is destroyed. In an extreme case, the principal surface 140a is returned to be almost flat. In other words, if the step of irradiation with ultraviolet rays is omitted, a desired shape may not be formed.

By contrast, in an embodiment according to the present disclosure, after being provided with a shape, the principal surface 140a is irradiated with ultraviolet rays. As a result, even if the light-transmissive member 140 is exposed to a high temperature environment of about 300° C., the shape of the concave portions 140d formed at the principal surface 140a is maintained. Therefore, the light-transmissive member 140, after being formed, may be put into a process performed in a high temperature environment. In an embodiment according to the present disclosure, the die 200 is pressed onto the resin body 140X in a cured state, unlike by a common thermal imprint method usable for a resin material in an uncured state. Therefore, the die 200 is easily separated from the resin body 140X.

Embodiment 2

Figure 7:
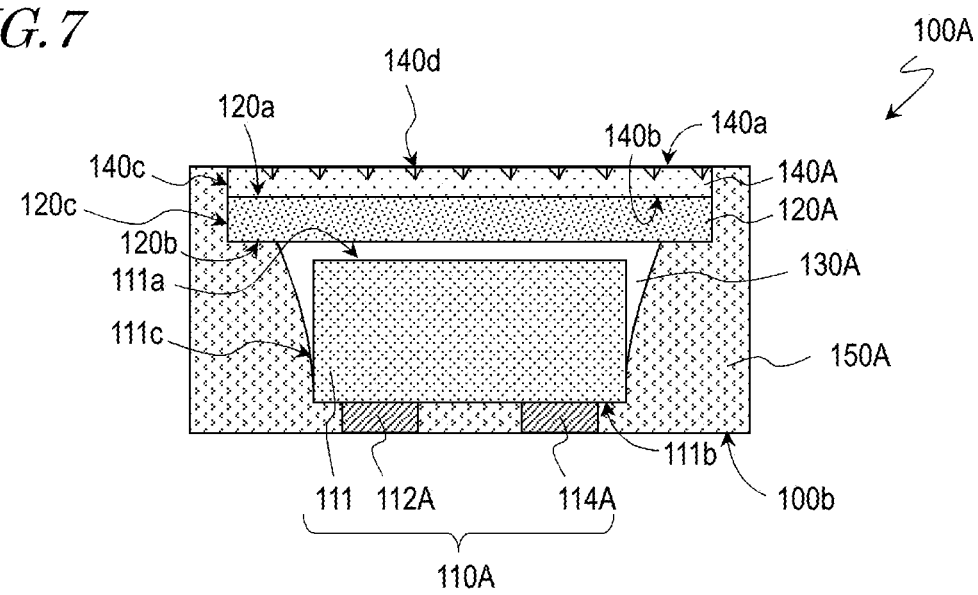
FIG. 7 is a cross-sectional view schematically showing a structure of an illustrative light emitting device produced by a production method in Embodiment 2 according to the present disclosure.

FIG. 7 schematically shows a cross-section of an illustrative light emitting device produced by a production method in Embodiment 2 according to the present disclosure. The light emitting device 100A shown in FIG. 7 includes a light emitting element 110A, a wavelength converting member 120A, a light guide member 130A, a light-transmissive member 140A, and a light-reflective member 150A.

The light emitting element 110A is, for example, an LED. In this example, the light-transmissive element 110 includes a main body 111, and also includes a positive electrode 112A and a negative electrode 114A located on the side of a bottom surface of the light emitting element 110A. In the structure shown in FIG. 7, a top surface of the light emitting element 110A matches a top surface 111a of the main body 111, and the positive electrode 112A and the negative electrode 114A are located on a bottom surface 111b of the main body 111 opposite to the top surface 111a.

The main body 111 includes, for example, a support substrate formed of sapphire, gallium nitride or the like, and a semiconductor stack structure provided on the support substrate. The semiconductor stack structure includes an active layer, and also includes an n-type semiconductor layer and a p-type semiconductor layer holding the active layer therebetween. The semiconductor stack structure may contain a nitride semiconductor capable of emitting light in the range of ultraviolet to visible light ($In_xAl_yGa_{1-x-y}N$, $0 \leq x$, $0 \leq y$, $x+y \leq 1$). The positive electrode 112A and the negative electrode 114A have a function of supplying a predetermined electric current to the semiconductor stack structure. As shown in FIG. 7, a bottom surface of the positive electrode 112A and a bottom surface of the negative electrode 114A are exposed from a bottom surface 100b of the light emitting device 100A. Therefore, the light emitting device 100A is considered to have a structure suitable to be mounted with a flip-chip connection.

In the structure shown in FIG. 7, the light emitting device 100A includes a stack structure, including the wavelength converting member 120A and the light-transmissive member 140A, above the top surface 111a of the main body 111. The wavelength converting member 120A has a top surface 120a, a bottom surface 120b and a side surface 120c located between the top surface 120a and the bottom surface 120b. The light-transmissive member 140A has a top surface 140a, a bottom surface 140b and a side surface 140c located between the top surface 140a and the bottom surface 140b. As shown in FIG. 7, in this example, the side surface 120c of the wavelength converting member 120A and the side surface 140c of the light-transmissive member 140A are covered with the light-reflective member 150A. The light guide member 130A includes a portion located between the bottom surface 120b of the wavelength converting member 120A and the top surface 111a of the main body 111, and another portion of the light guide member 130A covers at least a part of a side surface 111c of the main body 111. The side surface 111c of the main body 111 is located between the top surface 111a and a bottom surface 111b of the main body 111.

In this example, the light-transmissive member 140A is plate-shaped, like the light-transmissive member 140 in Embodiment 1. As schematically shown in FIG. 7, for example, the top surface 140a located above the top surface of the light emitting element 110A includes a plurality of concave portions 140d. The plurality of concave portions 140d have a depth of, for example, 0.9 μm or greater. As described below, the plurality of concave portions 140d may be formed in the light-transmissive member 140A by a method substantially the same as that in Embodiment 1. As described below by way of examples, the light-transmissive member 140A has a tacky property of, for example, 50% or lower of a tacky property of a surface of a silicone resin not irradiated with ultraviolet rays intentionally. The tacky property is found by a probe method as described below.

The light-transmissive member 140A may have a light transmittance of 60% or higher with respect to light having a peak emission wavelength of the light emitting element 110A. From the point of view of effective use of the light, the light transmittance of the light-transmissive member 140A with respect to the light having the peak emission wavelength of the light emitting element 110A is advantageously 70% or higher, and more advantageously 80% or higher.

In this example, the wavelength converting member 120A is plate-shaped, like the light-transmissive member 140A. The wavelength converting member 120A includes, for example, a matrix of a silicone resin or the like and a wavelength converting material such as a phosphor or the like. The wavelength converting member 120A absorbs at least a part of light from the light emitting element 110A and emits light having a wavelength different from a wavelength of the light incident from the light emitting element 110A.

The light-reflective member 150A has a shape enclosing the wavelength converting member 120A, the light-transmissive member 140A and the light guide member 130A, and covers at least the side surface 111c of the main body 111. In the example shown in FIG. 7, a part of the light-reflective member 150A covers a region of the bottom surface 111b of the main body 111 that excludes the positive electrode 112A and the negative electrode 114A. In this specification, the term "cover" encompasses a case where a covered member and a covering member are in direct contact with each other and also a case where, for example, another member is located between the covered member and the covering member and thus the covered member and the covering member are not in direct contact with each other. In this specification, the term "light-reflective" indicates that the reflectance with respect to the light having a peak emission wavelength of the light emitting element is 60% or higher. The reflectance of the light-reflective member 150A with respect to the light having the peak emission wavelength of the light emitting element 110A is advantageously 70% or higher, and more advantageously 80% or higher. It is advantageous that the light-reflective member 150A is white.

FIG. 8 is a flowchart showing an example of method for producing the light emitting device in Embodiment 2 according to the present disclosure. The production method shown in FIG. 8 generally includes a step of preparing a light emitting body including a light emitting element and a light-transmissive resin body (step S21) and a step of forming a light-transmissive member including a concave and convex pattern at a surface thereof and covering at least a top surface of the light emitting element (step S22). In the example described herein, as shown in FIG. 9, the step of forming the light-transmissive member includes a step of pressing a die onto a surface of the resin body in a heated state to form a plurality of concave portions at the surface of the resin body (step S221) and a step of irradiating the surface of the resin body, at which the plurality of concave portions are formed, with ultraviolet rays (step S222). The resin body onto which the die is to be pressed is, for example, a resin sheet formed by curing a silicone resin starting material. Hereinafter, with reference to FIG. 8 through FIG. 19, an illustrative method for forming the light emitting device 100A shown in FIG. 7 will be described in detail.

[Step of Preparing the Light Emitting Body]

Figure 10:
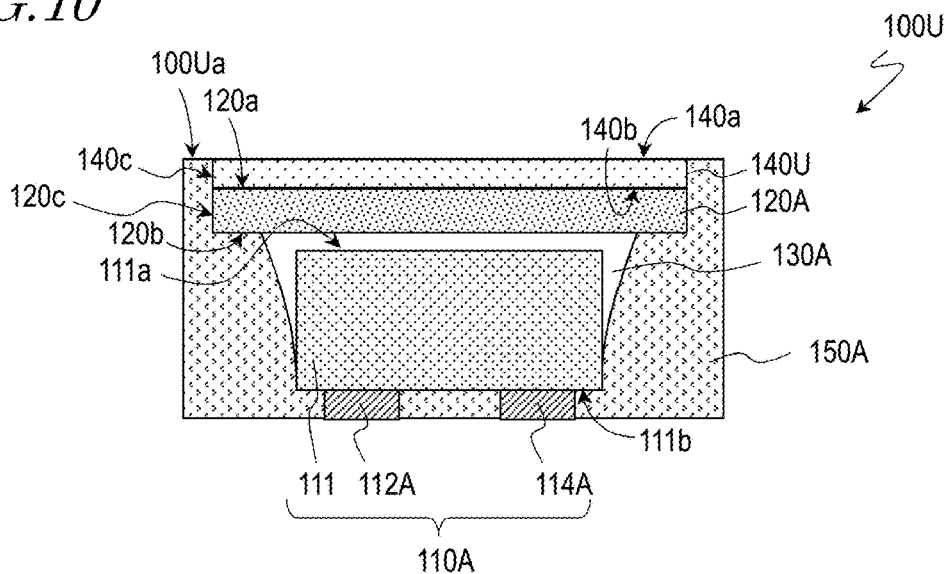
FIG. 10 is a schematic cross-sectional view showing an illustrative structure of a light emitting body including a light emitting element and a light-transmissive resin body.

First, a light emitting body including a light emitting element and a light-transmissive resin body is prepared (step S21 in FIG. 8). In this example, as shown in FIG. 10, a light emitting body 100U including the light emitting element 110A and a sheet-like resin body 140U located above the top surface of the light emitting element 110A is prepared. FIG. 10 schematically shows a cross-section of the light emitting body 100U taken along a line perpendicular to a top surface 100Ua of the light emitting body 100U.

The light emitting body 100U shown in FIG. 10 includes the wavelength converting member 120A, the light guide member 130A and the light-reflective member 150A in addition to the light emitting element 110A and the resin body 140U. As shown in FIG. 10, the light emitting body 100U includes a stack structure including the wavelength converting member 120A and the resin body 140U. The light-reflective member 150A covers the side surface 140c of the resin body 140U and the side surface 120c of the wavelength converting member 120A. The light emitting body 100U may be purchased or formed. The light emitting body 100U shown in FIG. 10 is formed as follows, for example.

Figure 11:
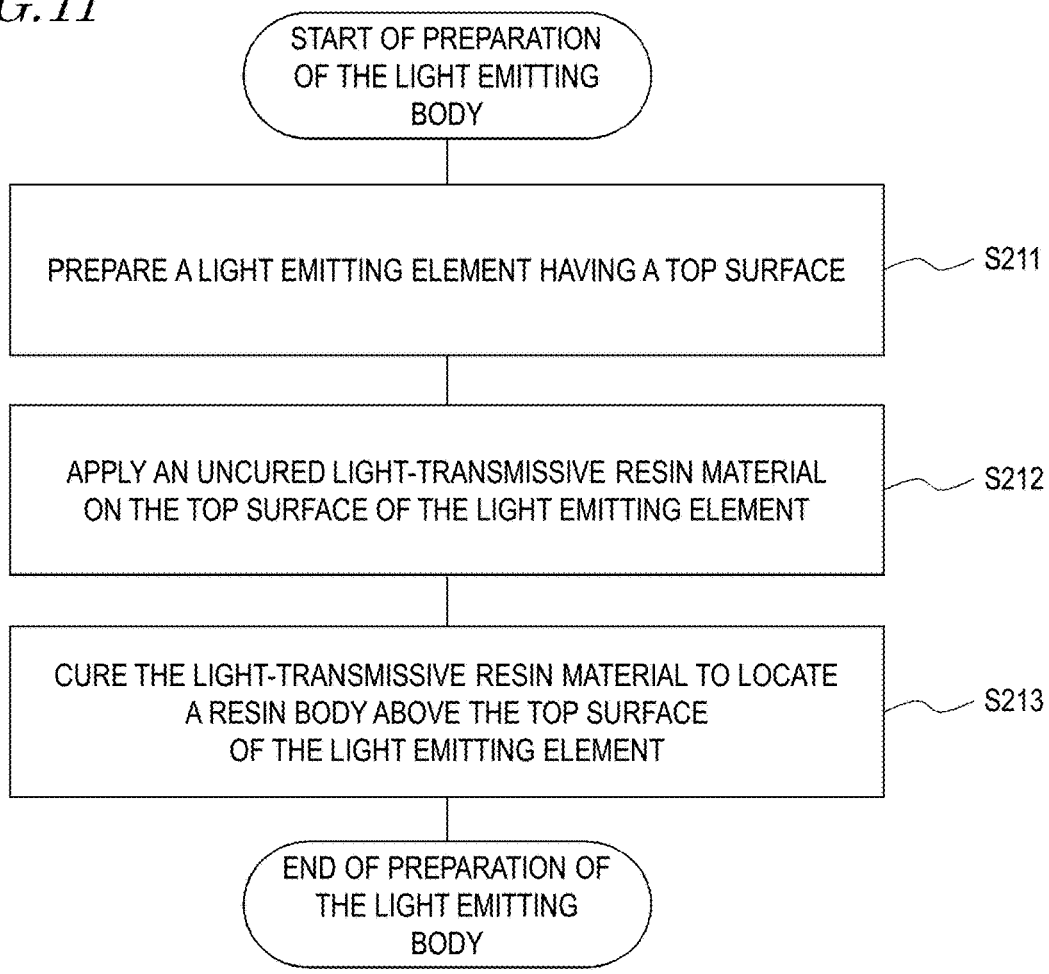
FIG. 11 is a flowchart showing steps that may be included in step S21 shown in FIG. 8.

FIG. 11 is a flowchart showing an illustrative method for preparing the light emitting body 100U. The method for preparing the light emitting body 100U includes, for example, a step of preparing a light emitting element having a top surface (step S211), a step of applying an uncured light-transmissive resin material on the top surface of the light emitting element (step S212) and a step of curing the light-transmissive resin material to locate a resin body above the top surface of the light emitting element (step S213).

Figure 12:
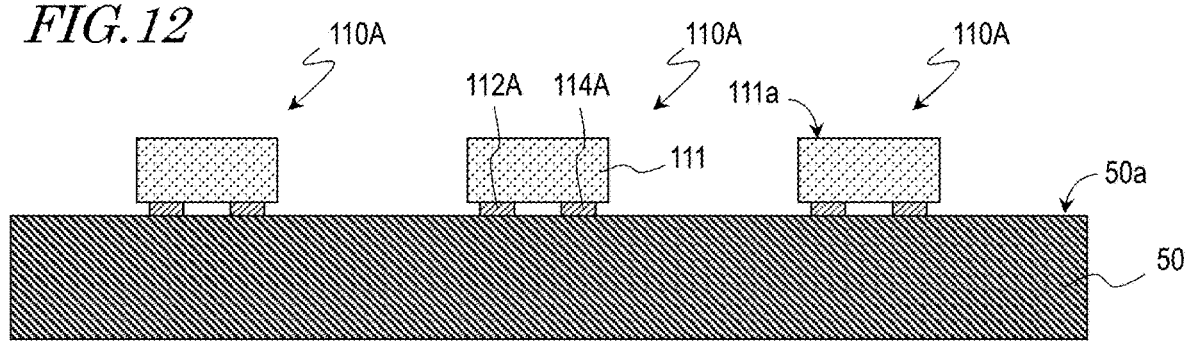
FIG. 12 is a schematic cross-sectional view showing an illustrative method for forming the light emitting body.

First, the light emitting element 110A having the top surface and also including the positive electrode 112A and the negative electrode 114A on the bottom surface 111b opposite to the top surface is prepared (step S211 in FIG. 11). The light emitting element 110A may be purchased. Next, a support body 50 formed of a heat-resistant adhesive sheet, substrate or the like is prepared. The light emitting element 110A is located on the support body 50 such that the positive electrode 112A and the negative electrode 114A face the support body 50. In this example, as shown in FIG. 12, a plurality of the light emitting elements 110A are temporarily secured to a top surface 50a of the support body 50. For the sake of simplicity, FIG. 12 shows three light emitting elements 110A arrayed in a left-right direction on the paper of FIG. 12. Needless to say, the light emitting elements 110A may be arrayed two-dimensionally on the top surface 50a.

Figure 13:
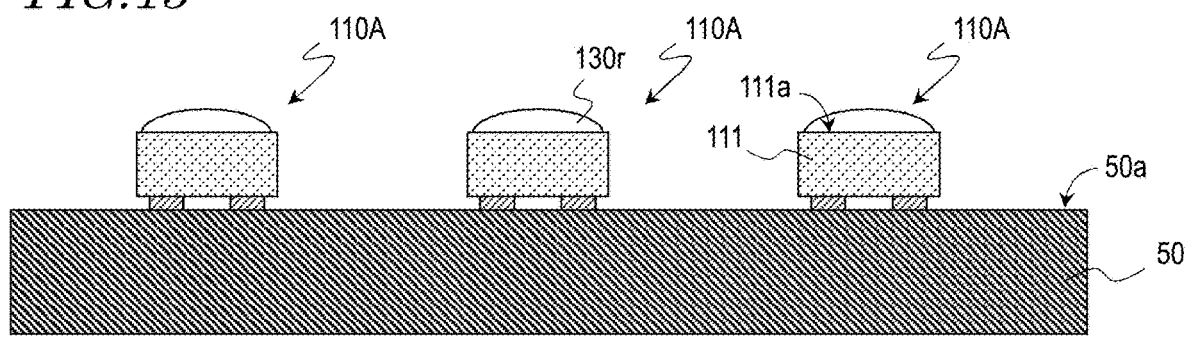
FIG. 13 is a schematic cross-sectional view showing the illustrative method for forming the light emitting body.

Next, as shown in FIG. 13, a light-transmissive first resin material 130r is put on the top surface 111a serving as the top surface of the light emitting element 110A by a dispenser or the like (step S212 in FIG. 11). The first resin material 130r contains, as a matrix, a material containing silicone resin, silicone modified resin, epoxy resin, phenol resin, polycarbonate resin, acrylic resin trimethylpentene resin or polynorbornene resin, or a combination of at least two of these materials.

Figure 14:
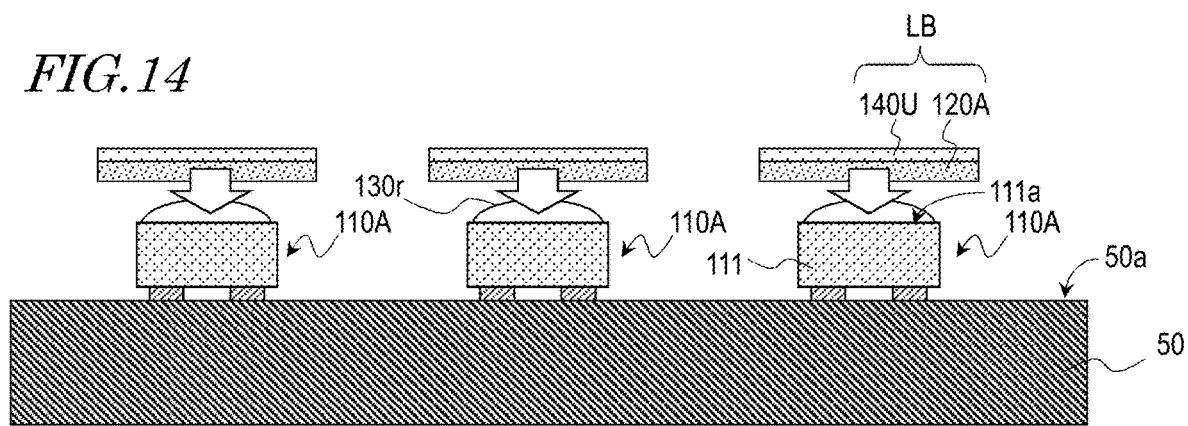
FIG. 14 is a schematic cross-sectional view showing illustrative method for forming the light emitting body 100U.
Figure 15:
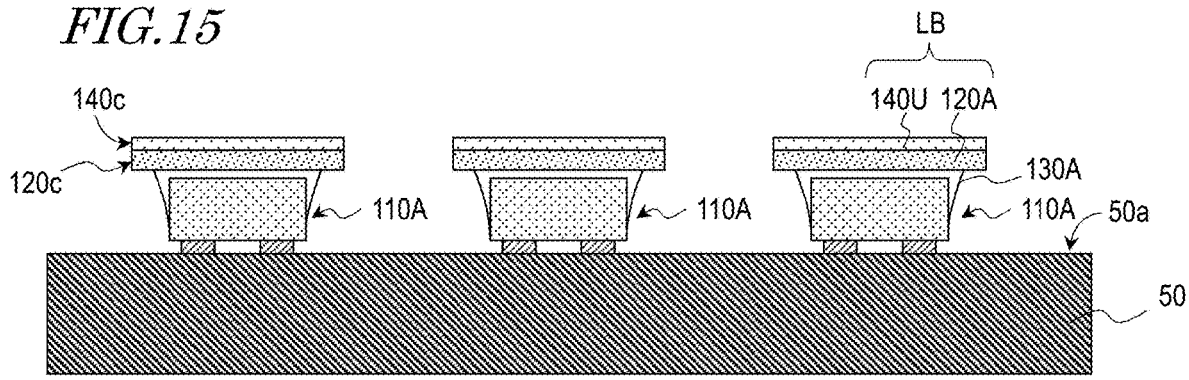
FIG. 15 is a schematic cross-sectional view showing the illustrative method for forming the light emitting body.

Next, as schematically shown in FIG. 14, the wavelength converting member 120A and the resin body 140U are located on the first resin material 130r, and the first resin material 130r is cured. In this example, a stack sheet LB including the wavelength converting member 120A and the resin body 140U is prepared, and thus the wavelength converting member 120A and the resin body 140U are located on the first resin material 130r at the same time. After the stack sheet LB is located, the first resin material 130r is cured. As a result, as shown in FIG. 15, the light guide member 130A is formed, and the resin body 140U is located above the top surface of the light emitting element 110A (step S213 in FIG. 11). After the first resin material 130r is cured, the side surface 120a of the wavelength converting member 120A and the side surface 140c of the resin body 140U may be trimmed by a dicing saw or the like. As a result, a plurality of the light emitting bodies 100U each including the light emitting element 110A and the resin body 140U covering at least the top surface of the light emitting element 110A are formed.

The stack sheet LB may be prepared as follows, for example. A resin in a resin material having particles of a phosphor dispersed therein is put into a B-staged state to form a phosphor sheet. The phosphor sheet and a light-transmissive resin sheet are prepared and heated to be bonded together. The resultant assembly is cut by an ultrasonic cutter or the like into a piece of a predetermined size.

The phosphor sheet may be formed of a second resin material containing a phosphor, a resin material such as a silicone resin or the like, filler particles and a solvent. Usable as the phosphor is a known phosphor such as a YAG-based phosphor, a KSF-based phosphor, CASN and a β-SiAlON phosphor described above. The light-transmissive resin sheet may be formed by, for example, curing a silicone resin starting material in an uncured state. The silicone resin starting material may contain a silicone resin as a matrix and additionally contain a light-reflective filler or the like. The silicone resin as the matrix may contain an organic polysiloxane including at least one phenyl group in a molecule, and/or an organic polysiloxane including a D unit.

The stack sheet LB may alternatively be formed by applying the second resin material on a principal surface of a light-transmissive sheet by coating such as spraying, casting, potting or the like, and curing the second resin material. Still alternatively, the stack sheet LB may be purchased. The phosphor sheet and/or the light-transmissive sheet may be purchased.

Figure 16:
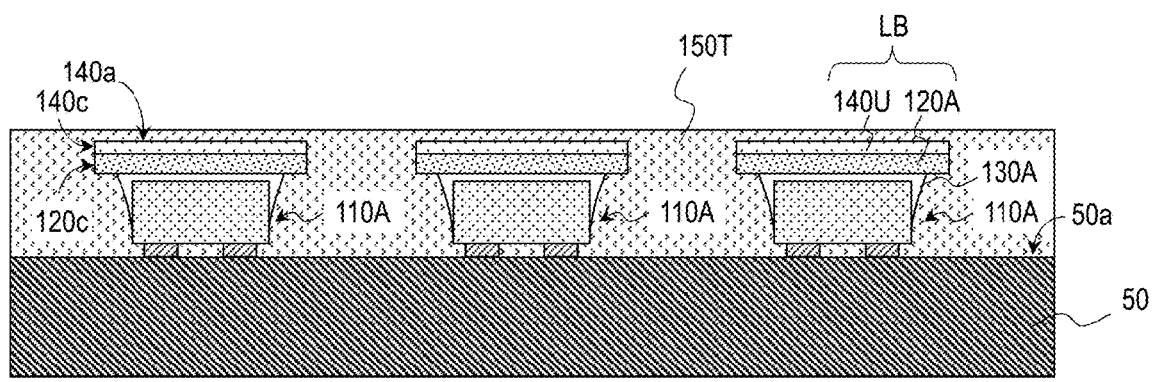
FIG. 16 is a schematic cross-sectional view showing the illustrative method for forming the light emitting body.

After the light guide member 130A is formed, a light-reflective member covering the side surface 111c of the main body 111, which corresponds to a side surface of the light emitting element 110A, may be formed. For example, as shown in FIG. 16, the components on the support body 50 are covered with a light-reflective resin layer 150T. The light-reflective resin layer 150T may be formed as follows, for example. A third resin material having particles of a light-reflective filler dispersed therein is put on the top surface of the support body 50, and the third resin material is cured. The third resin material may contain, as a matrix, silicone resin, phenol resin, epoxy resin, BT resin, polyphthalamide (PPA) or the like. The particles of the light-reflective filler may be the light-scattering particles described above. The light-reflective resin layer 150T may be formed by, for example, transfer molding. In the state shown in FIG. 16, the top surface 140a of the resin body 140U is covered with the light-reflective resin layer 150T.

Figure 17:
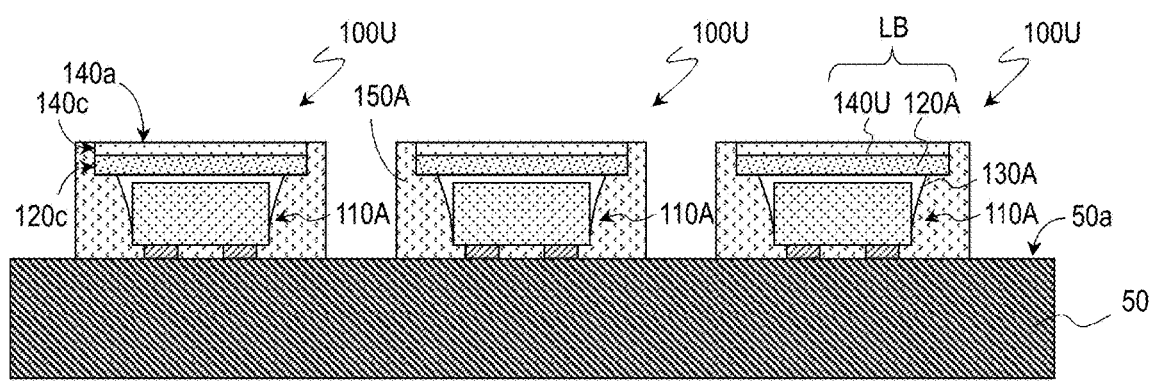
FIG. 17 is a schematic cross-sectional view showing the illustrative method for forming the light emitting body.

Next, a part of the light-reflective resin layer 150T is removed from the side of a top surface thereof by grinding or the like to expose the top surface 140a of the resin body 140U from the ground surface. Then, the components on the support body 50 are cut into a desired shape by a dicing saw or the like. For example, the post-grinding light-reflective resin layer 150T is cut at a position between two light emitting elements 110A adjacent to each other. As a result of such steps of grinding and cutting the light-reflective resin layer 150T, the light-reflective member 150A is formed as shown in FIG. 17. Then, the components on the support body 50 are removed from the support body 50. As a result, the light emitting body 100U shown in FIG. 10 is formed.

[Step of Forming the Light-Transmissive Member]

After the light emitting body 100U is prepared, the die is pressed onto the surface of the resin body, specifically, the top surface 140a of the resin body 140U in this example, to form the plurality of concave portions at the top surface 140a (step S221 in FIG. 9). The step of forming the concave portions at the top surface 140a of the resin body 140U may be performed in substantially the same manner as described above with reference to FIG. 2 through FIG. 4 regarding the formation of the concave portions 140q at the top surface 140a of the resin body 140X.

Figure 18:
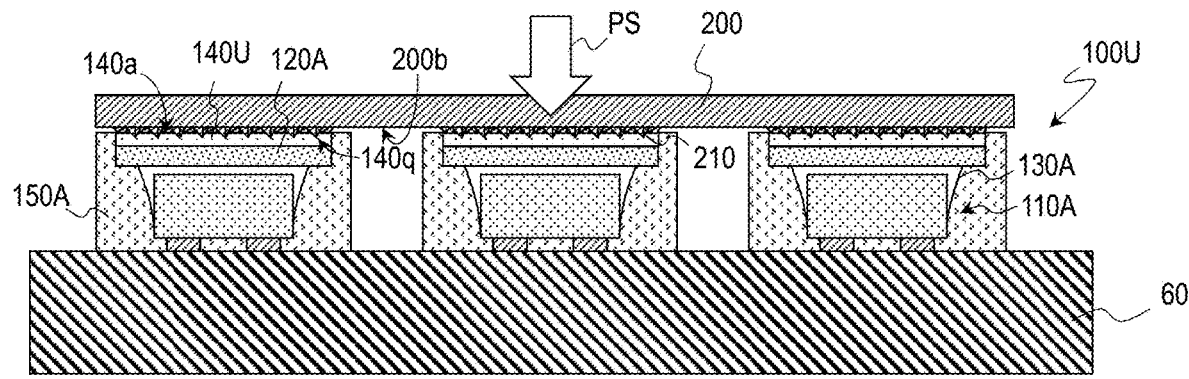
FIG. 18 is a schematic cross-sectional view showing a method for forming the light emitting device in Embodiment 2 according to the present disclosure.

For example, as schematically shown in FIG. 18, like in the example shown in FIG. 2, the light emitting body 100U is located on the support body 60, and the die 200 including the plurality of convex portions 210 is located such that the plurality of convex portions 210 face the top surface 140a of the resin body 140U (corresponding to, for example, the top surface 140a of the resin body 140X). Then, the ambient temperature is raised to about 70° C. to about 300° C., and the die 200 is pressed onto the top surface 140a of the resin body 140U in a heated state like in the example shown in FIG. 4. The resin body 140U may be heated by raising the temperature around the light emitting body 100U.

As a result of the resin body 140U being heated and the die 200 being pressed, the plurality of concave portions (corresponding to the concave portion 140q shown in FIG. 4) shaped in accordance with the plurality of convex portions 210 of the die 200 are formed at the top surface 140a of the resin body 140U (step S221 in FIG. 9). The die 200 may be pressed onto the resin body 140U at the same time for all the plurality of the light emitting bodies 100U as shown in FIG. 18, or separately for each of the plurality of light emitting bodies 100U. The concave portions 140q may be selectively formed at the top surface 140a of the resin body 140U, or in the entirety of the top surface 100Ua of the light emitting body 100U.

Next, the top surface 140a of the resin body 140U, at which the plurality of concave portions 140q are formed, are irradiated with ultraviolet rays (step S222 in FIG. 9). This step may be performed in substantially the same manner as described above with reference to FIG. 5 regarding the irradiation of the principal surface 140a of the resin body 140X. For example, like in the example shown in FIG. 5, the top surface 140a of the resin body 140U, at which the plurality of concave portions 140q are formed, are irradiated with ultraviolet rays by use of the ultraviolet ray irradiation device 500.

Figure 19:
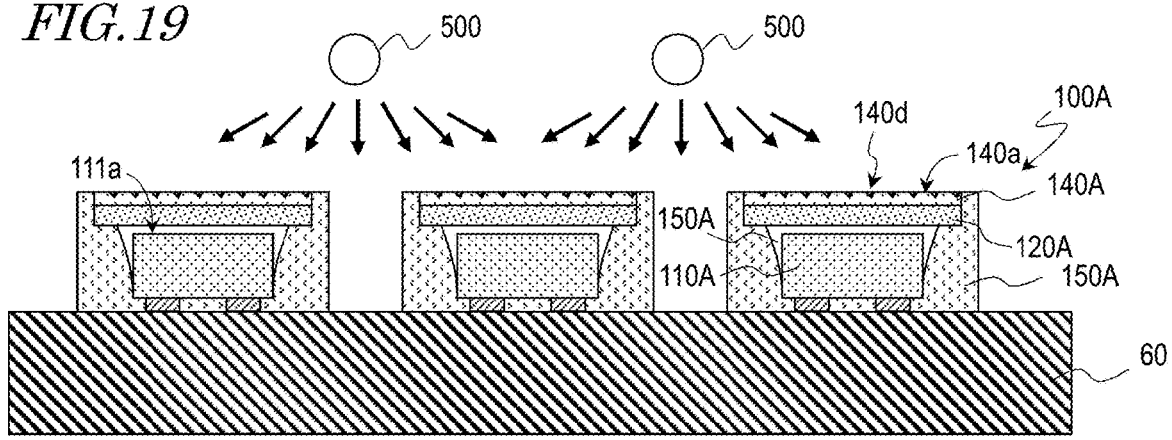
FIG. 19 is a schematic cross-sectional view showing the method for forming the light emitting device in Embodiment 2 according to the present disclosure.

The ultraviolet rays may be directed selectively toward the top surface 140a of the resin body 140U, which is a part of the top surface 110Ua of the light emitting bodies 100U. As a result of the irradiation with the ultraviolet rays, as shown in FIG. 19, the light-transmissive member 140A including the plurality of concave portions 140d and covering the top surface of the light emitting element 110A is formed.

As a result of the above-described steps, the light emitting device 100A shown in FIG. 7 is produced. In FIG. 19, the concave portions 140d are shown larger than the actual size thereof, for the sake of convenience, like in FIG. 6. In the other drawings of the present disclosure, the concave portions 140d or the concave portions 140q may be shown larger than the actual size thereof, for the sake of convenience.

In Embodiment 2 according to the present disclosure, the surface 140a of the light-transmissive member 140A covering the light emitting element 110A, may be provided with a microscopic pattern to improve the light extraction efficiency. In the case where the light-transmissive member 140A is located on the light output side of the light emitting element 110A, as in the light emitting device 100A, it is advantageous that the light-transmissive member 140A is formed of a thermosetting resin in consideration of the deterioration caused by the light from the light emitting element 110A. In an embodiment according to the present disclosure, the surface 140a of the resin body 140U in a cured state is provided with a concave and convex pattern. This is advantageous to improve the light extraction efficiency. Japanese Patent Publication No. 2016-001639 does not conceive that the light emitting element is covered with a resin material and that a concave and convex pattern is formed at a surface of the resin in a cured state.

In the above-described example, the stack sheet LB is located on the first resin material 130r put on the top surface of the light emitting element 110A, and then the first resin material 130r is cured to form the stack sheet LB above the light emitting element 110A in a fixed state. At this point, the light guide member 130A is formed of the first resin material 130r. The light guide member 130A has a function of reflecting light emitted from the side surface 111c of the main body 111, which is the side surface of the light emitting element 110A, upward with respect to the light emitting device 100A. Therefore, the formation of the light guide member 130A improves the light extraction efficiency.

In the above-described example, the light emitting device 100A includes the light-reflective member 150A enclosing the light guide member 130A and covering a region of the bottom surface 111b of the main body 111 excluding the positive electrode 112A and the negative electrode 114A. Therefore, light from the side surface or the bottom surface 100b of the light emitting device 100A is suppressed from leaking, and thus the light extraction efficiency is further improved.

In the above-described example, the resin body 140U is once buried in the light-reflective resin layer 150T, then the top surface 140a of the resin body 140U is exposed from the light-reflective resin layer 150T, and after this, the concave and convex pattern is formed at the top surface 140a. Conventionally, with a production method by which a light-transmissive member such as the resin body 140U is buried in a light-reflective resin layer, it is difficult to form a concave and convex pattern at the surface of the light-transmissive member exposed at the ground surface after being once buried. By contrast, in an embodiment according to the present disclosure, the surface of the cured resin body 140U is provided with a shape. Therefore, after a light emitting device usable as a product is produced, the light-transmissive member may be provided with a shape. Thus, it is expected to improve the light extraction efficiency of the light emitting device.

As described above with reference to FIG. 7, in this example, the positive electrode 112A, and the negative electrode 114A are exposed from the bottom surface 100b of the light emitting device 100A. The light emitting device 100A may be mounted on a wiring board or the like by, for example, reflow. In this embodiment, like in Embodiment 1, the top surface 140a of the light-transmissive resin body 140U is provided with a shape and then is irradiated with ultraviolet rays. Therefore, even if the light-transmissive member 140A is exposed to a high temperature environment, the shape of the concave portions 140d is maintained. Namely, an embodiment according to the present disclosure is advantageously applicable to a process performed at a high temperature such as reflow or the like. For example, after the light emitting device 100A is heated at a temperature of 300° C. for 40 minutes, the depth of the concave portions 140d may change by 25% or less. The change in the depth of the concave portions 140d may be defined by |Dq−Dp|/Dp, where Dp is the average value of the depth of the concave portions 140d at any ten positions before the heating, and Dq is the average value of the depth of the concave portions 140d at any ten positions after the heating.

Figure 20:
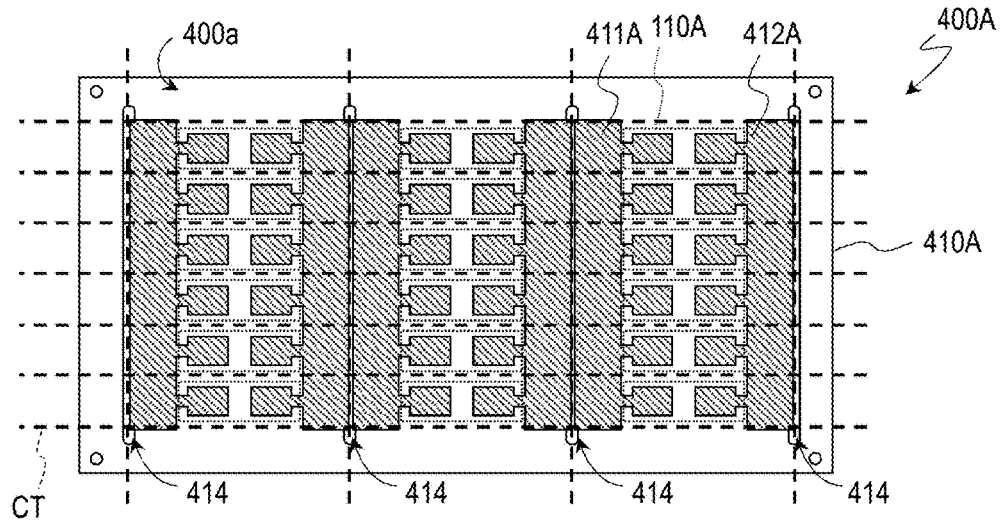
FIG. 20 is a schematic plan view showing an example of composite substrate including a base plate, and a first conductive portion and a second conductive portion provided on the base plate.

Instead of the support body 50 described above, a composite substrate 400A shown in FIG. 20 may be used. The composite substrate 400A includes a base plate 410A and also includes a first conductive portion 411A and a second conductive portion 412A provided on the base plate 410A. FIG. 20 shows an example of external appearance of the composite substrate 400A as seen from a top surface 400a thereof. As schematically shown in FIG. 20, the base plate 410A includes through-holes 414. Although not shown in FIG. 20, a part of the first conductive portion 411A and a part of the second conductive portion 412A extend to a bottom surface of the base plate 410A, opposite to the top surface 400a, via the through-holes 414.

In the case where the composite substrate 400A including the base plate 410A is used, for example, the plurality of light emitting elements 110A are secured to the top surface 400a of the composite substrate 400A by flip-chip connection, instead of being temporarily secured to the support body 50 (see FIG. 12). At this point, the positive electrode 112A and the negative electrode 114A of each light emitting element 110A are respectively connected with the first conductive portion 411A and the second conductive portion 412A by a joining member such as solder or the like. In FIG. 20, the rectangles enclosed by the thin dashed line indicate the areas where the light emitting elements 110A are located. After the light guide member 130A and the light-transmissive resin body 140U are located, the components on the top surface 400a of the composite substrate 400A are covered with the light-reflective resin layer 150T in substantially the same manner as in the step described above with reference to FIG. 16.

After the top surface 140a of the resin body 140U is exposed from the light-reflective resin layer 150T by grinding or the like, the plurality of concave portions 140d are formed in substantially the same manner as in the example described above with reference to FIG. 18 and FIG. 19. Then, the light-reflective resin layer 150T and the composite substrate 400A are cut simultaneously by a dicing saw or the like at positions represented by the thick dashed lines CT in FIG. 20. As a result, a plurality of light emitting devices 100B are produced.

Figure 21:
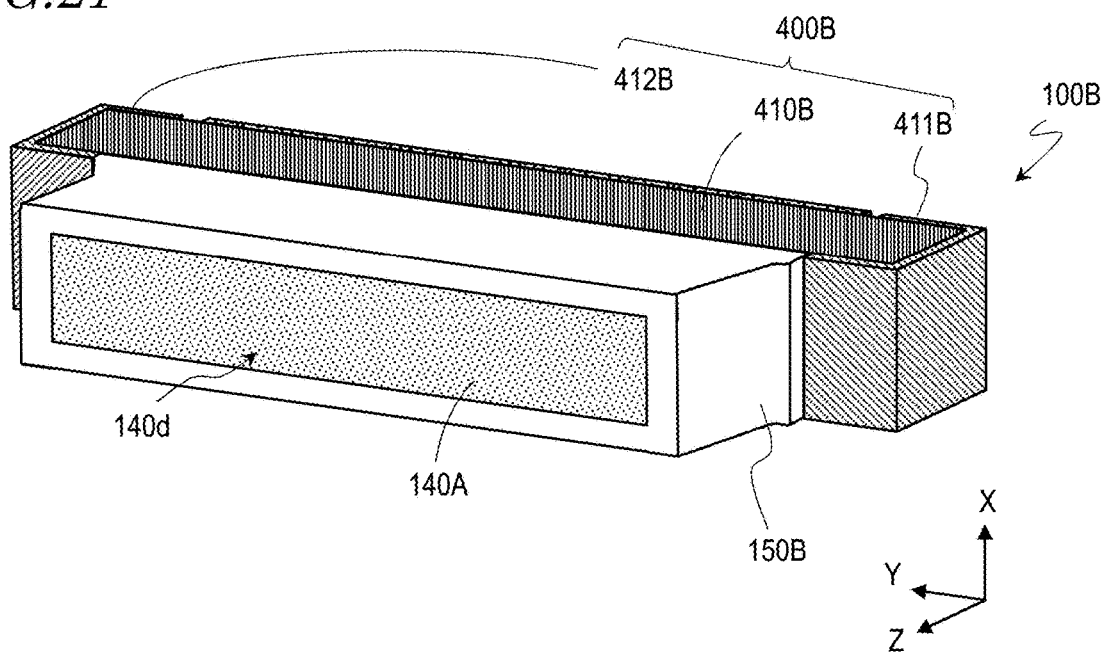
FIG. 21 is a perspective view showing an example of external appearance of a light emitting device.
Figure 22:
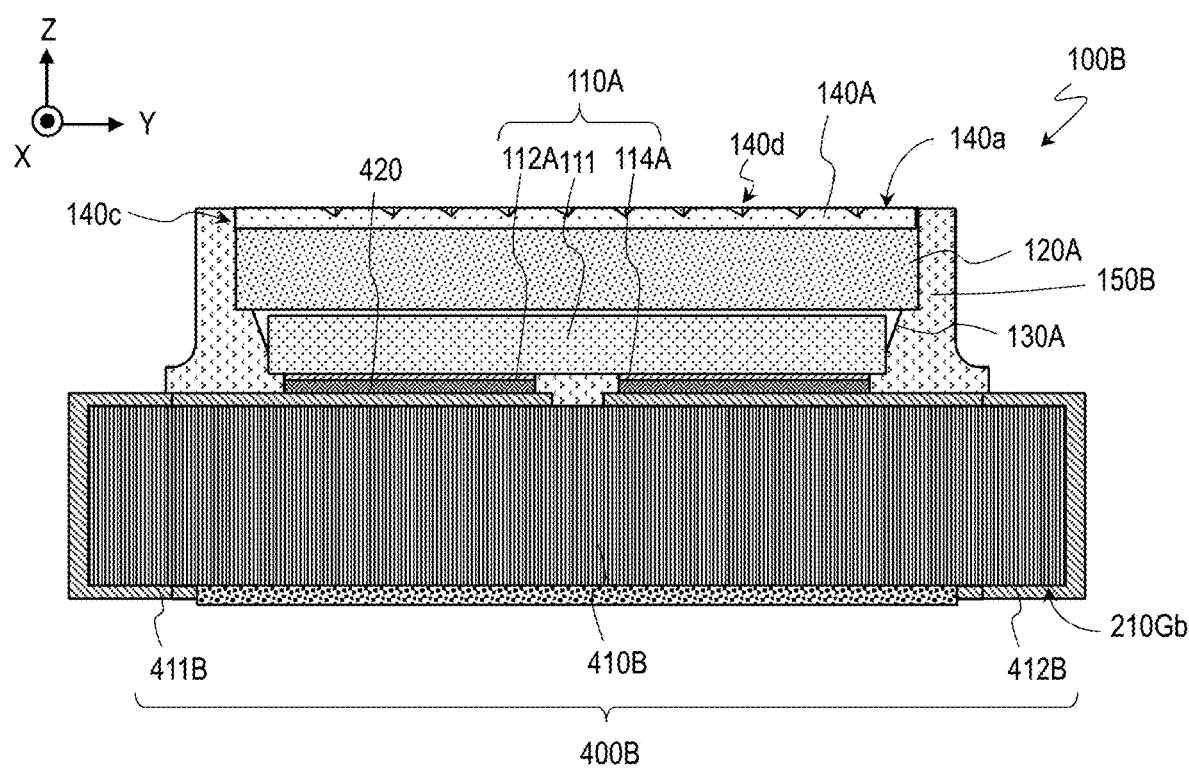
FIG. 22 schematically shows a cross-section of the light emitting device shown in FIG. 21 taken along a plane parallel to a YZ plane in FIG. 21, at a central position or in the vicinity thereof of the light emitting device.

FIG. 21 shows an example of external appearance of one light emitting device 100B. FIG. 22 schematically shows a cross-section of the light emitting device 100B taken along a plane parallel to a YZ plane in FIG. 21, at approximately the center of the light emitting device 100B. As shown in FIG. 21 and FIG. 22, the light emitting device 100B includes a light-reflective member 150B covering the side surface 140c of the light-transmissive member 140A and also includes a composite substrate 400B. The composite substrate 400B includes a base plate 410B, a first conductive portion 411B and a second conductive portion 412B. As shown in FIG. 22, the first conductive portion 411B and the second conductive portion 412B are respectively electrically connected with the positive electrode 112A and the negative electrode 114A via joining members 420. In the structure shown in FIG. 22, the light-reflective member 150B reaches the composite substrate 400B and covers the joining members 420.

The base plate 410B, the first conductive portion 411B and the second conductive portion 412B are respectively a part of the base plate 410A, a part of the first conductive portion 411A and a part of the second conductive portion 412A shown in FIG. 20. In the structure shown in FIG. 21 and FIG. 22, the light emitting device 100B is longer in a Y-axis direction than in an X-axis direction, and is used as a so-called side view-type light emitting device.

Figure 23:
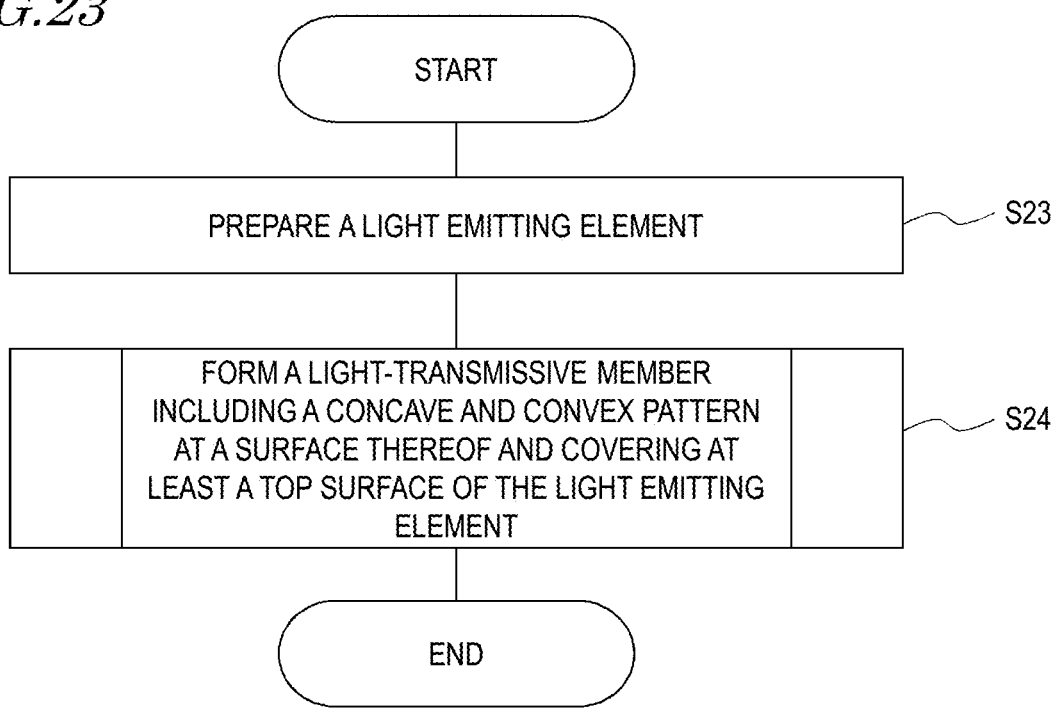
FIG. 23 is a flowchart showing another example of method for producing a light emitting device in Embodiment 2 according to the present disclosure.
Figure 24:
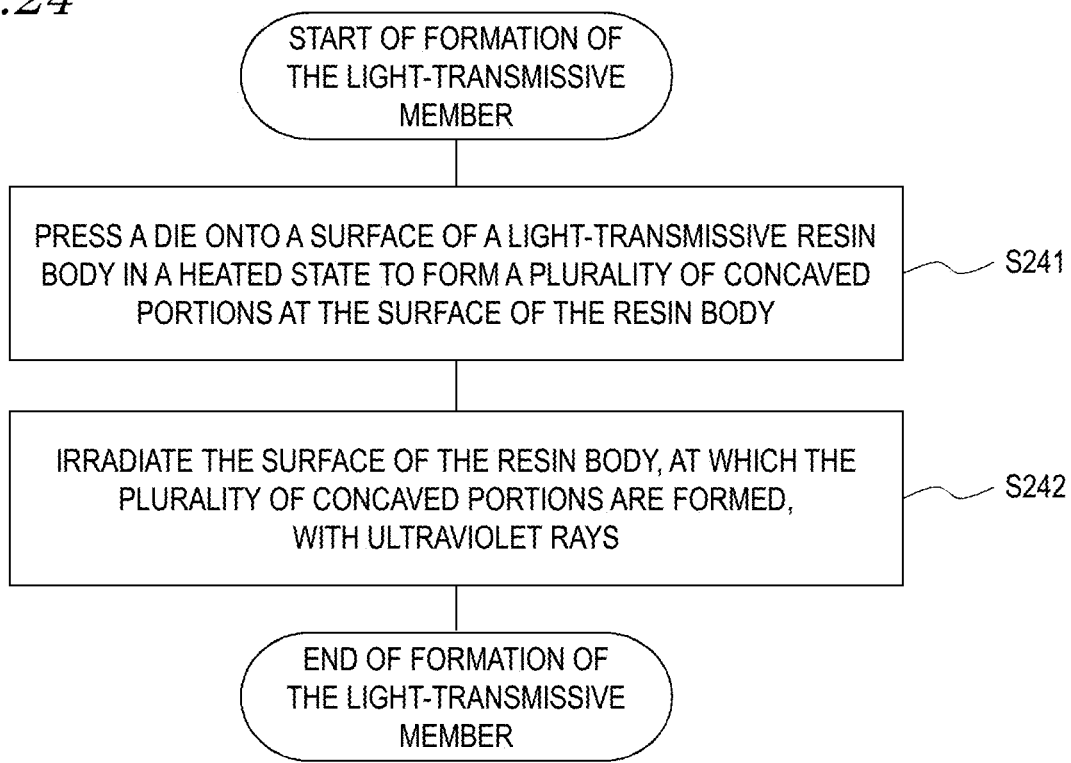
FIG. 24 is a flowchart showing steps that may be included in step S24 shown in FIG. 23.

The light emitting device 100A shown in FIG. 7 may also be produced as described below. FIG. 23 is a flowchart showing another example of method for producing a light emitting device in Embodiment 2 according to the present disclosure. The method for producing the light emitting device shown in FIG. 23 generally includes a step of preparing a light emitting element (step S23) and a step of forming a light-transmissive member including a concave and convex pattern at a surface thereof and covering at least a top surface of the light emitting element (step S24). In this example, as shown in FIG. 24, the step of forming the light-transmissive member (step S24 in FIG. 23) includes a step of pressing a die onto a surface of a light-transmissive resin body in a heated state to form a plurality of concave portions at the surface of the resin body (step S241) and a step of irradiating the surface of the resin body, at which the plurality of concave portions are formed, with ultraviolet rays (step S242). The resin body onto which the die is to be pressed is a resin sheet including a light-transmissive portion formed by curing a silicone resin starting material.

Figure 25:
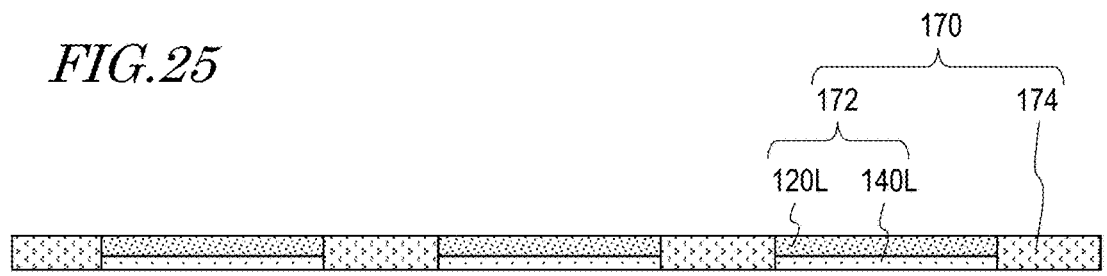
FIG. 25 is a schematic cross-sectional view showing the another example of method for producing the light emitting device in Embodiment 2 according to the present disclosure.

First, as shown in FIG. 25, a first resin layer 170 including a light-transmissive portion 172 is prepared. The resin layer 170 may include two or more light-transmissive portions 172. In the structure shown in FIG. 25, the resin layer 170 includes a light-reflective resin portion 174, and the light-transmissive portions 172 are separated from each other by the light-reflective resin portion 174. In this example, the light-transmissive portions 172 each include a light-transmissive layer 140L and a wavelength converting layer 120L. The resin layer 170 may be formed as follows, for example.

First, a light-reflective resin sheet is prepared. The light-reflective resin sheet may be formed of the third resin material described above. The light-reflective resin sheet may be formed of, for example, a silicone resin having particles of titanium dioxide and particles of silicon oxide dispersed therein at a content of about 60% by weight. The light-reflective sheet may be formed by compression molding, transfer molding, injection molding, printing or spraying.

Next, through-holes are formed in the light-reflective resin sheet by punching or the like. The through-holes are, for example, rectangular as seen in a plan view. After being formed, the through-holes are filled with, for example, the second resin material described above containing a silicone resin as a matrix by potting, printing, spraying or the like. At this point, the particles of a phosphor in the second resin material filling the through-holes may be precipitated to cure the second resin material, so that a light-transmissive portion having different phosphor concentrations in the thickness direction is formed. For example, a light-transmissive portion in which the particles of the phosphor are more densely distributed in a region closer to a bottom surface thereof may be formed. Alternatively, a transparent resin material may be located inside of the through-holes and cured, and then the second resin material may be located on the transparent resin material to fill the through-holes.

In the case where the particles of the phosphor are precipitated, and the resin sheet is put upside down after the second resin material is cured, the resin layer 170, as shown in FIG. 25, including the light-reflective resin portion 174 and the plurality of light-transmissive portions 172 is formed. In the structure shown in FIG. 25, the light-transmissive layer 140L included in each light-transmissive portion 172 has a lower concentration of the particles of the phosphor than that of the wavelength converting layer 120L also included in the light-transmissive portion 172. FIG. 25 shows the wavelength converting layer 120L and the light-transmissive layer 140L as being clearly separated from each other along a border. However, no clear border may be recognized between the wavelength converting layer 120L and the light-transmissive layer 140L.

Figure 26:
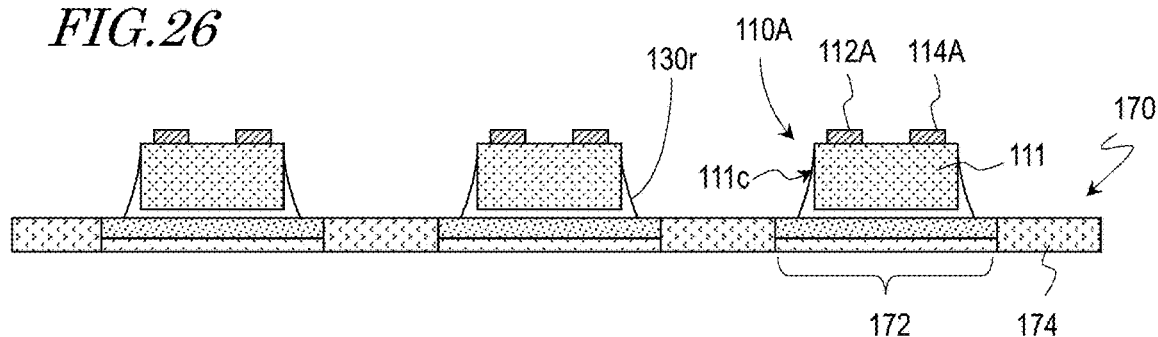
FIG. 26 is a schematic cross-sectional view showing the another example of method for producing the light emitting device in Embodiment 2 according to the present disclosure.

Next, the light-transmissive first resin material 130r is put on regions of the resin layer 170 in which the light-transmissive layers 172 are located, by a dispenser or the like. Then, the light emitting element 110A is prepared (step S23 in FIG. 23), and as shown in FIG. 26, is located on the first resin material 130r such that the positive electrode 112A and the negative electrode 114A are located opposite to the resin layer 170. As a result, the first resin material 130r is located on at least a part of the side surface 111c of the main body 111. The first resin material 130r is cured to form the light guide member 130A of the first resin material 130r.

Figure 27:
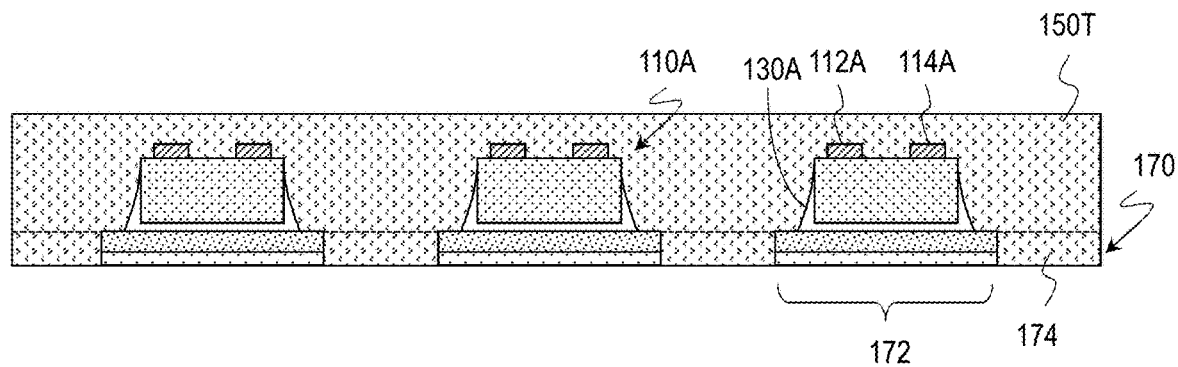
FIG. 27 is a schematic cross-sectional view showing the another example of method for producing the light emitting device in Embodiment 2 according to the present disclosure.

Next, as shown in FIG. 27, the light-reflective resin layer 150T is formed as a second resin layer covering the components on the resin layer 170. The light-reflective resin layer 150T may be formed of the material used to form the light-reflective resin sheet described above, namely, the third resin material described above, like the light-reflective resin portion 174 of the resin layer 170. The light-reflective resin layer 150T may be formed by, for example, transfer molding.

Figure 28:
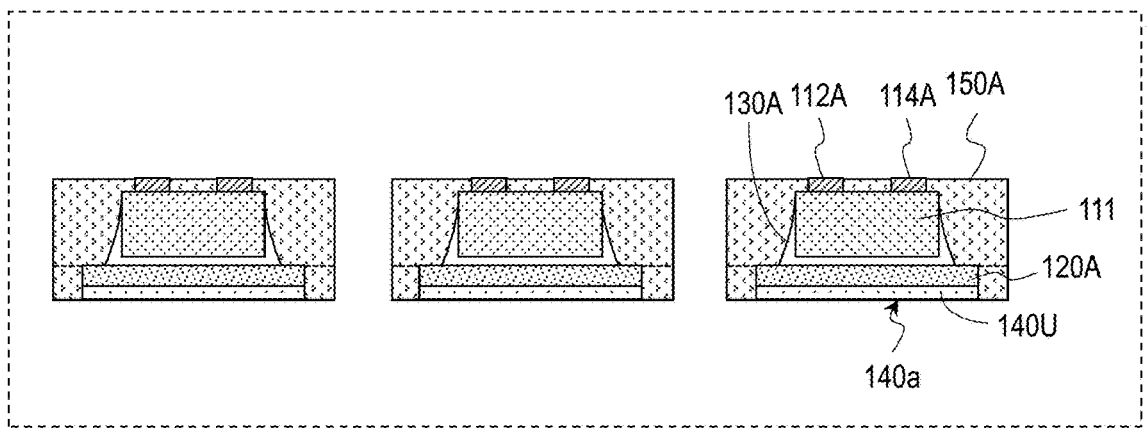
FIG. 28 is a schematic cross-sectional view showing the another example of method for producing the light emitting device in Embodiment 2 according to the present disclosure.

Next, a part of the light-reflective resin layer 150T is removed from the side of the top surface thereof by grinding or the like to expose the positive electrode 112A and the negative electrode 114A of each of the light emitting elements 110A from the ground surface. Then, the resin layer 170 and the light-reflective resin layer 150T are cut by a dicing saw or the like at a position between two light emitting elements 110A adjacent to each other. As a result, the light-reflective member 150A is formed of the light-reflective resin portion 174 and the light-reflective resin layer 150T. As shown in FIG. 28, a plurality of light emitting bodies, each having substantially the same structure as that of the light emitting body 100U shown in FIG. 10, are formed. In this example, the light-transmissive layer 140L and the wavelength converting layer 120L of the light-transmissive portion 172 of the resin layer 170 respectively correspond to the light-transmissive resin body 140U and the wavelength converting member 120A shown in FIG. 10.

Next, the light-transmissive member 140A covering at least the top surface of the light emitting element 110A is formed of the resin body 140U. The step of forming the light-transmissive member 140A may be performed in substantially the same manner as described above with reference to FIG. 18 and FIG. 19.

For example, first, as shown in FIG. 18, the light emitting body 100U is located on the support body 60, and the die 200 including the plurality of convex portions 210 is located such that the plurality of convex portions 210 face the top surface 140a of the resin body 140U. In substantially the same manner as in the example shown in FIG. 4, the die 200 is pressed onto the top surface 140a of the resin body 140U in a heated state. As a result of the resin body 140U being heated and the die 200 being pressed, a plurality of concave portions are formed at the top surface 140a of the resin body 140U (step S241 in FIG. 24).

Then, the top surface 140a of the resin body 140U, at which the plurality of concave portions are formed, is irradiated with ultraviolet rays (step S242 in FIG. 24). This step may also be performed in substantially the same manner as described above with reference to FIG. 5 regarding the irradiation of the principal surface 140a of the resin body 140X with the ultraviolet rays. For example, in substantially the same manner as in the example shown in FIG. 5, the principal surface 140a of the resin body 140U, at which the plurality of concave portions 140q are formed, are irradiated with ultraviolet rays by use of the ultraviolet ray irradiation device 500. As a result of the irradiation with the ultraviolet rays, the light-transmissive member 140A including the plurality of concave portions 140d and covering the top surface of the light emitting element 110A is formed. Alternatively, the plurality of concave portions 140d may be formed at the surface of the light-transmissive portions 172 of the resin layer 170 in substantially the same manner as described above with reference to FIG. 2 through FIG. 5.

Modification of Embodiment 2

Figure 29:
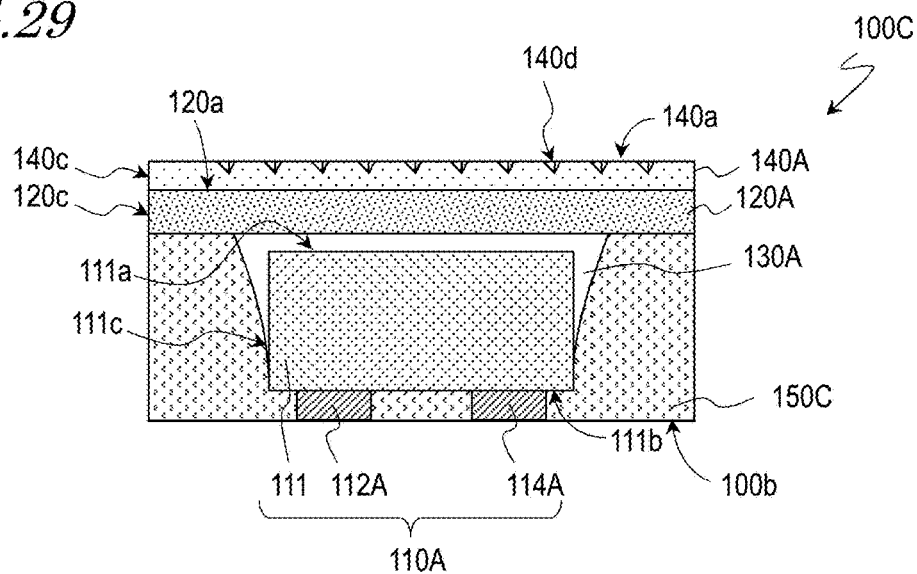
FIG. 29 is a cross-sectional view schematically showing another example of light emitting device produced by a production method in Embodiment 2 according to the present disclosure.

FIG. 29 shows another example of light emitting device produced by a production method in Embodiment 2. A light emitting device 100C shown in FIG. 29 includes the light emitting element 110A, the wavelength converting member 120A, the light guide member 130A and the light-transmissive member 140A like in the example described above with reference to FIG. 7 and also includes a light-reflective member 150C. The light-transmissive member 150C is substantially the same as the light-transmissive member 150A of the light emitting device 100A shown in FIG. 7 in that the light-reflective member 150C encloses the side surface of the light emitting element 110A and covers a region of the bottom surface 111b of the main body 111 excluding the positive electrode 112A, and the negative electrode 114A. In this example, the light-reflective member 150C does not cover the side surface 120c of the wavelength converting member 120A or the side surface 140c of the light-transmissive member 140A, unlike the light-reflective member 150A of the light emitting device 100A.

Figure 30:
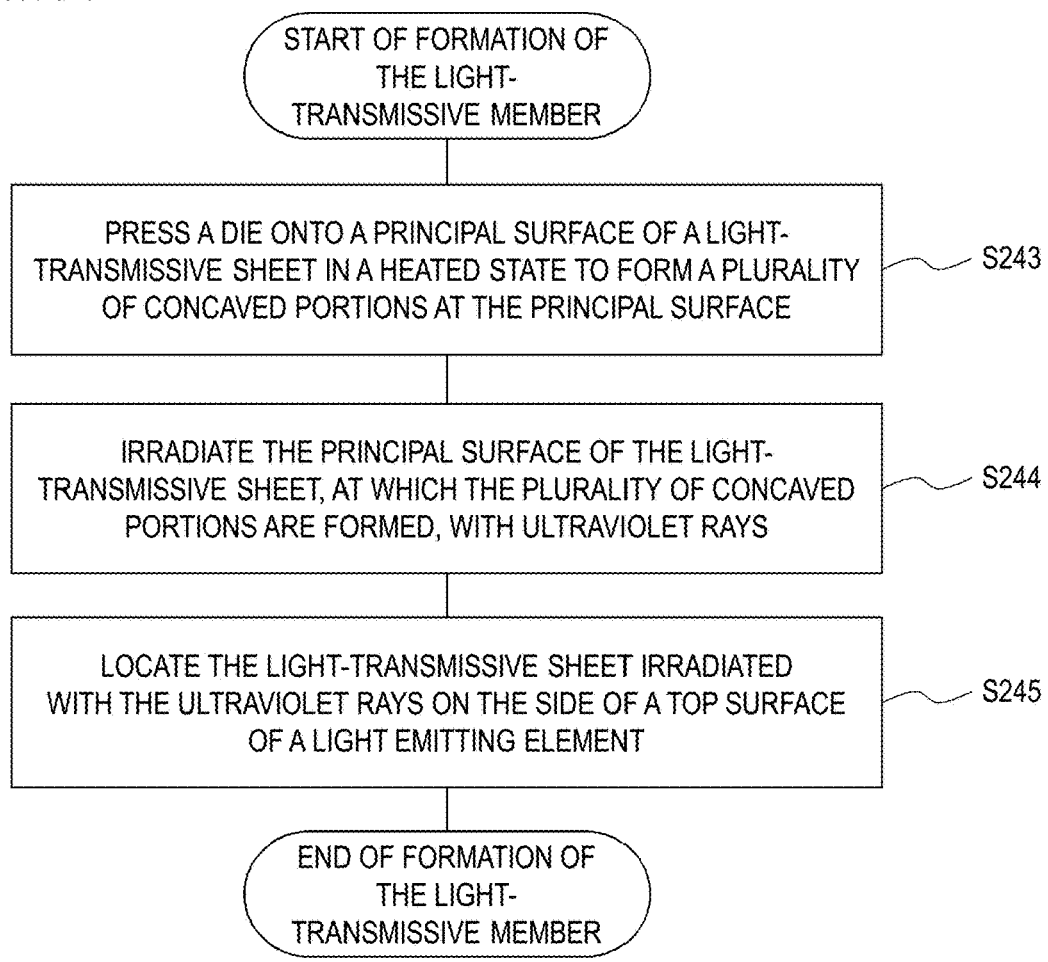
FIG. 30 is a flowchart showing another example of steps that may be included in step S24 shown in FIG. 23.

In general, the light emitting device 100C shown in FIG. 29 may be produced by the steps of the flowchart shown in FIG. 23, like in the example described above with reference to FIG. 25 through FIG. 28. It should be noted that as shown in FIG. 30, the step of forming the light-transmissive member 140A includes a step of pressing a die onto a principal surface of a light-transmissive sheet in a heated state to form a plurality of concave portions at the principal surface (step S243), a step of irradiating the principal surface of the light-transmissive sheet, at which the plurality of concave portions are formed, with ultraviolet rays (step S244), and a step of locating the light-transmissive sheet irradiated with the ultraviolet rays on the side of a top surface of a light emitting element (step S245). The light-transmissive sheet onto which the die is to be pressed is formed by curing a silicone resin starting material. Hereinafter, an illustrative method for producing the light emitting device 100C will be described in detail with reference to the drawings.

Figure 31:
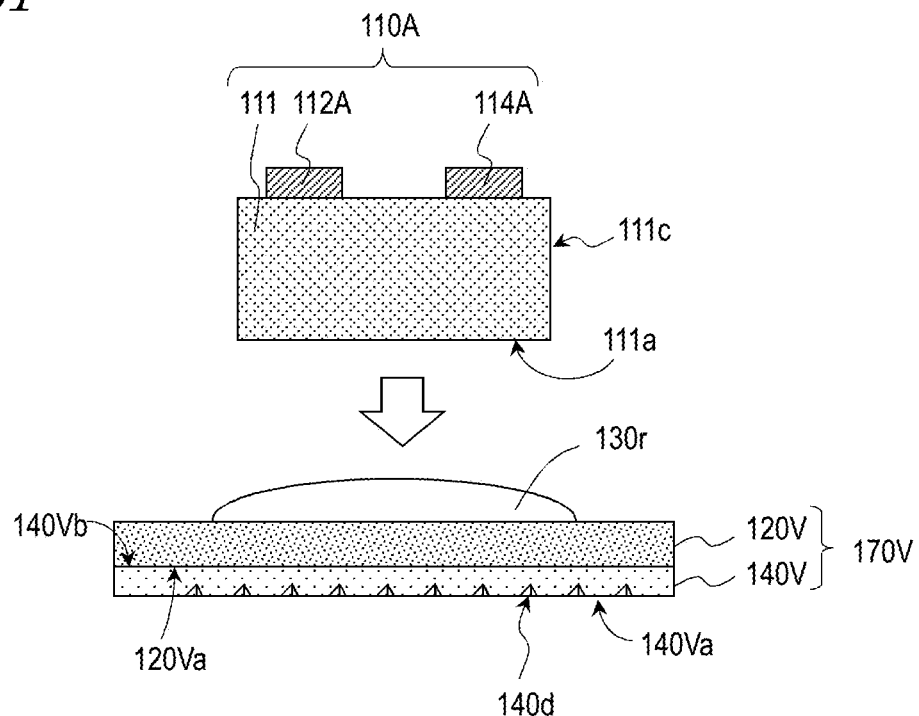
FIG. 31 is a schematic cross-sectional view showing still another example of method for producing the light emitting device in Embodiment 2 according to the present disclosure.

First, the light emitting element 110A is prepared (step S23 in FIG. 23). The light-transmissive member 140A covering at least the top surface of the light emitting element 110A is formed (step S24 in FIG. 23). In this example, the light-transmissive member 140A is formed as follows. First, a stack sheet 170V, as shown in FIG. 31, including a wavelength converting layer 120V and a light-transmissive layer 140V is prepared. In this example, the light-transmissive layer 140V has a principal surface 140Va and a principal surface 140Vb. The principal surface 140Vb faces one principal surface 120Va of the wavelength converting layer 120V. As schematically shown in FIG. 31, the light-transmissive layer 140V includes a plurality of concave portions 140d at the principal surface 140Va. The stack sheet 170V may be formed in, for example, substantially the same manner as the stack sheet LB described above.

First, a light-transmissive resin sheet having a principal surface (hereinafter, may be referred to simply as the "light-transmissive sheet") is prepared. The light-transmissive sheet may be formed by, for example, curing an uncured silicone resin starting material. After the light-transmissive sheet is prepared, a die is pressed onto a principal surface of the light-transmissive sheet in a heated state to form a plurality of concave portions at the principal surface of the light-transmissive sheet (step S243 in FIG. 30). The resin body 140X described above is an example of the light-transmissive sheet. The step of forming the concave portions at the principal surface of the light-transmissive sheet may be performed in substantially the same manner as described above with reference to FIG. 2 through FIG. 4 regarding the formation of the plurality of concave portions 140q at the principal surface 140a of the resin body 140X. For example, the light-transmissive sheet is located on the support body 60 in substantially the same manner as in the example shown in FIG. 2, and the die 200 is pressed onto the principal surface of the light-transmissive sheet in a heated state in substantially the same manner as in the example shown in FIG. 4.

Next, the principal surface of the light-transmissive sheet, at which the plurality of concave portions corresponding to the plurality of convex portions 210 of the die 200 are formed, is irradiated with ultraviolet rays (step S244 in FIG. 30). This step may be performed in substantially the same manner as described above with reference to FIG. 5 regarding the irradiation of the principal surface 140a of the resin body 140X with the ultraviolet rays. When necessary, the light-transmissive sheet, after being irradiated with the ultraviolet rays, is cut into a predetermined size. As a result of these steps, the light-transmissive sheet including the plurality of concave portions 140d at the principal surface 140a, like the light-transmissive sheet 140 shown in FIG. 6, is formed. In this example, the light-transmissive sheet has, for example, a rectangular external shape as seen in a plan view. Then, the wavelength converting layer 120V is formed at a principal surface of the light-transmissive sheet opposite to the principal surface 140a. As a result of the formation of the wavelength converting layer 120V, the stack sheet 170V including the above-described light-transmissive sheet as the light-transmissive layer 140V is formed.

The wavelength converting layer 120V may be formed by substantially the same technique as for the formation of the stack layer LB. For example, a resin in a resin material having particles of a phosphor dispersed therein is put into a B-staged state to form a phosphor sheet, and the phosphor sheet is located on the principal surface of the light-transmissive sheet opposite to the principal surface 140a. The phosphor sheet and the light-transmissive sheet are heated to be bonded together. Thus, the stack sheet 170V including the wavelength converting layer 120V and the light-transmissive layer 140V is formed. Alternatively, the second resin material may be put on the principal surface of the light-transmissive sheet opposite to the principal surface 140a and then cured to form the wavelength converting layer 120V. The stack sheet 170V may be purchased. The plurality of concave portions 140d may be formed after the wavelength converting layer 120V is formed on one of the principal surfaces of the light-transmissive layer 140V. For example, after the wavelength converting layer 120V is formed on one of the principal surfaces of the light-transmissive layer 140V, the plurality of concave portions 140d may be formed on the principal surface of the light-transmissive layer 140V opposite to the wavelength converting layer 120V.

Figure 32:
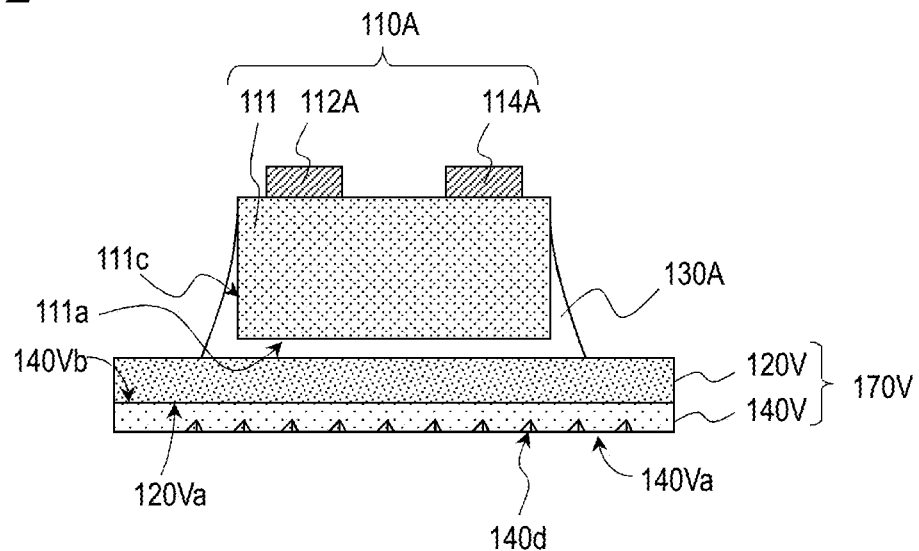
FIG. 32 is a schematic cross-sectional view showing the still another example of method for producing the light emitting device in Embodiment 2 according to the present disclosure.

Then, the light-transmissive sheet irradiated with the ultraviolet rays is located on the side of the top surface of the light emitting element 110A (step S245 in FIG. 30). In this example, as schematically shown in FIG. 31, the first resin material 130r is put on the wavelength converting layer 120V, and the light emitting element 110A is located on the first resin material 130r. At this point, the light emitting element 110A is located on the first resin material 130r such that the top surface 111a of the main body 111 faces the stack sheet 170V. As a result, the first resin material 130r is located on at least a part of the side surface 111c of the main body 111. The first resin material 130r is cured, and as a result, as shown in FIG. 32, the light guide member 130A is formed, and thus the above-described light-transmissive sheet is located as the light-transmissive layer 140V on the side of the top surface of the light emitting element 110A. FIG. 31 shows one light emitting element 110A. Alternatively, a plurality of the light emitting elements 110A may be located on the stack sheet 170V, as in the example shown in FIG. 26, in which the plurality of light emitting element 110A are located on the resin layer 170.

Figure 33:
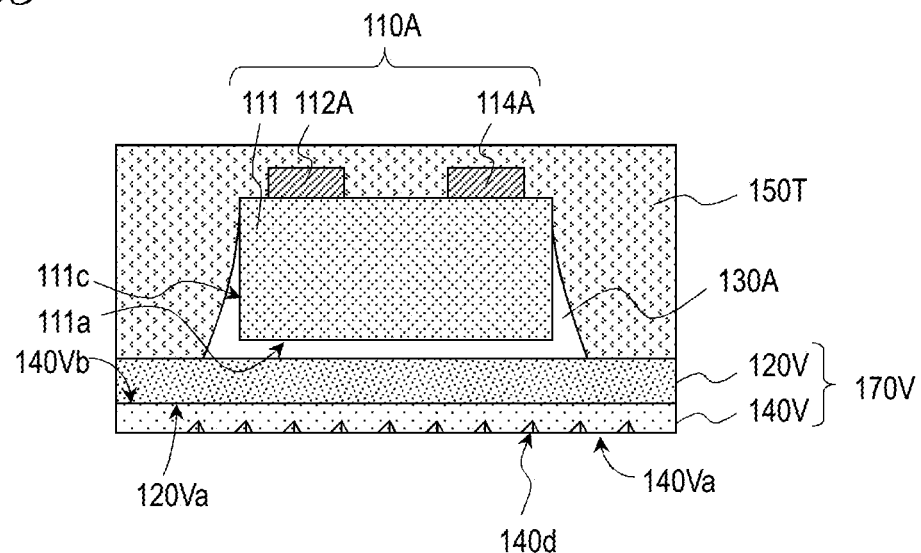
FIG. 33 is a schematic cross-sectional view showing the still another example of method for producing the light emitting device in Embodiment 2 according to the present disclosure.

Next, for example, the third resin material is put on the stack sheet 170V to cover the components on the stack sheet 170V with the third resin material, and the third resin material is cured. As a result of the third resin material being cured, as shown in FIG. 33, the light-reflective resin layer 150T covering the light emitting element 110A and the light guide member 130A is formed. The light-reflective resin layer 150T is formed by, for example, transfer molding.

Figure 34:
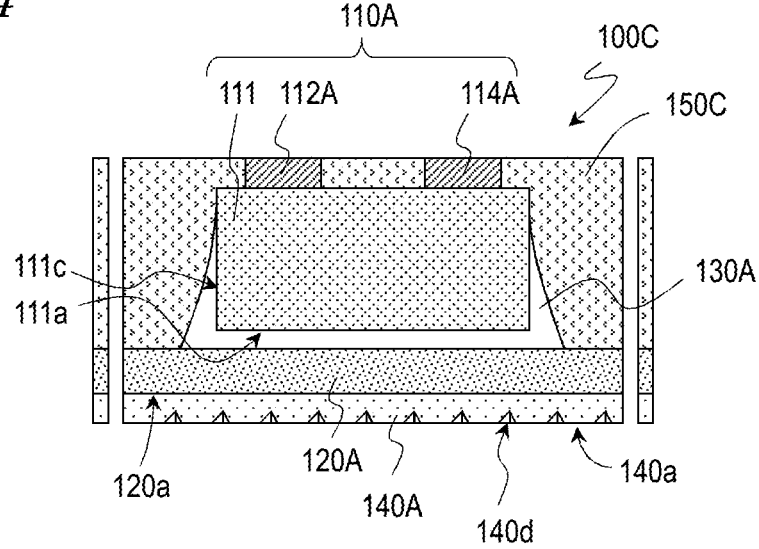
FIG. 34 is a schematic cross-sectional view showing the still another example of method for producing the light emitting device in Embodiment 2 according to the present disclosure.

Then, the light-reflective resin layer 150T is, for example, ground to expose the positive electrode 112A and the negative electrode 114A from the ground surface, and as shown in FIG. 34, the stack sheet 170V and the light-reflective resin layer 150T are cut into a desired shape by a dicing saw or the like. As a result of the above-described steps, the light-transmissive member 140A and the wavelength converting member 120A are formed of the stack sheet 170V, and the light-reflective member 150C is formed of the light-reflective resin layer 150T. As a result, the light emitting device 100C shown in FIG. 29 is produced. The light-transmissive sheet in this example includes the plurality of concave portions 140d at the light-transmissive layer 140V, among the wavelength converting layer 120V and the light-transmissive layer 140V of the stack sheet 170V. The light emitting device 100C is not limited to this, and a phosphor sheet including a plurality of concave portions formed by substantially the same technique as described above with reference to FIG. 2 through FIG. 5 may be used as the wavelength converting layer 120V. In this case, the light-transmissive layer 140V may be omitted, and the light-transmissive member located above the top surface of the light emitting element 110A may be formed of the wavelength converting layer 120V.

In this embodiment, it is not indispensable that the principal surface 140a at which the concave portions 140d are formed is the top surface of the light emitting device. The principal surface 140a at which the concave portions 140d are formed may be located to face the top surface of the light emitting element or the light emitting body. Alternatively, the principal surface 140a and the principal surface 140b may both be provided with the concave and convex pattern. The inside of the concave portions 140d may be filled with the air or a material having a refractive index different from that of the material used to form the light-transmissive member 140A. In either case, it is common to the above-described examples that the concave and convex pattern is formed at the surface of the light-transmissive member 140A.

Embodiment 3

In the above-described examples, the die 200 is pressed onto a light-transmissive plate-like or sheet-like body, and such a body is irradiated with ultraviolet rays to form the concave portions 140d. However, as described below, it is not indispensable for any embodiment according to the present disclosure that the target to be provided with a concave and convex pattern is plate-like or sheet-like.

Figure 35:
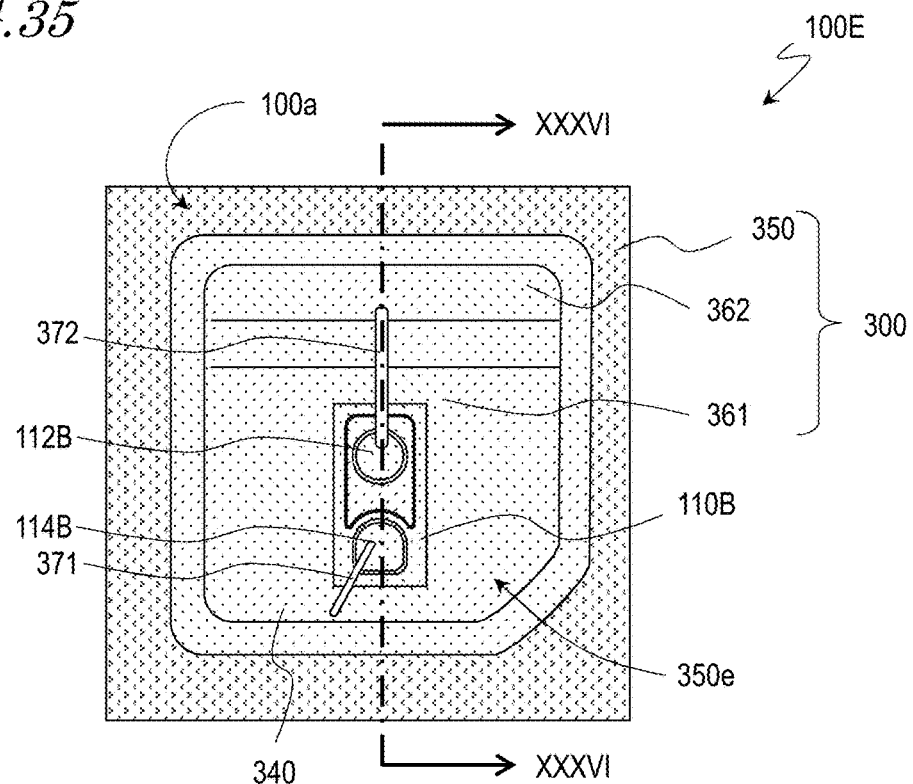
FIG. 35 is a plan view schematically showing an external appearance of an illustrative light emitting device produced by a production method in Embodiment 3 according to the present disclosure.
Figure 36:
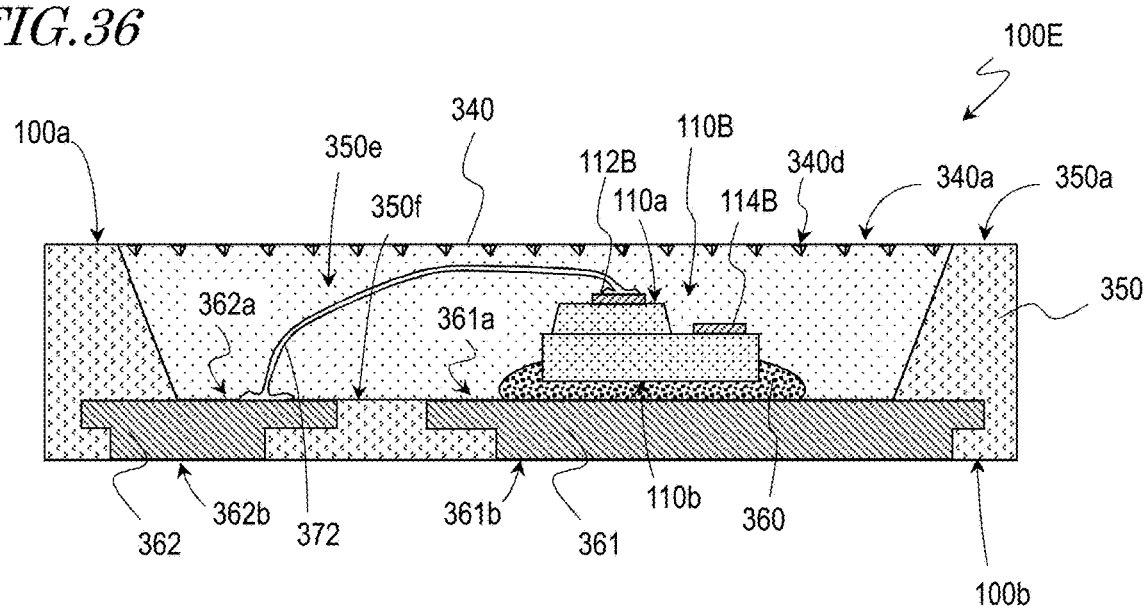
FIG. 36 is a cross-sectional view schematically showing the illustrative light emitting device produced by the production method in Embodiment 3 according to the present disclosure.

FIG. 35 and FIG. 36 show an example of light emitting device produced by a production method in Embodiment 3. FIG. 35 shows an illustrative external appearance of a light emitting device 100E as seen in a plan view, and FIG. 36 is a cross-sectional view of the light emitting device 100E taken along line XXXVI-XXXVI in FIG. 35.

The light emitting device 100E shown in FIG. 35 and FIG. 36 generally includes a light emitting element 110B and a resin package 300. The resin package 300 includes a resin portion 350 enclosing the light emitting element 110B and a pair of conductive leads 361 and 362. A concave portion 350e is provided at a center of the resin portion 350 of the resin package 300, and the light emitting element 110B is located inside the concave portion 350e. The resin portion 350 is formed of, for example, the third resin material having particles of a light-reflective filler dispersed therein, like the light-reflective members 150A through 150C described above, and has a function of reflecting light emitted from the light emitting element 110B to output the light outside from a top surface 100a of the light emitting device 100E.

As shown in FIG. 36, a part of a top surface 361a of the conductive lead 361 and a part of a top surface 362a of the conductive lead 362 form a part of a bottom surface 350f of the concave portion 350e, and a bottom surface 361b of the conductive lead 361 and a bottom surface 362b of the conductive lead 362 are exposed from a bottom surface 100b of the light emitting device 100E. In this example, the light emitting element 110B is secured to the conductive lead 361 by a joining member 360. The joining member 360 is formed of an insulating material such as a resin material or the like, for example, epoxy resin, silicone resin or the like or a conductive material such as an Ag paste or the like.

In the structure shown in FIG. 35 and FIG. 36, the light emitting element 110B includes a positive electrode 112B and a negative electrode 114B on a top surface 110a opposite to a bottom surface 110b. The positive electrode 112B and the negative electrode 114B are respectively connected with conductive wires 372 and 371 formed of Au, Al, Cu or the like. In this example, the positive electrode 112B is electrically connected with the conductive lead 362 via the conductive wire 372, and the negative electrode 114B is electrically connected with the conductive lead 361 via the conductive wire 371.

The light emitting device 100E further includes a light-transmissive member 340 located inside the concave portion 350e. As schematically shown in FIG. 36, the light-transmissive member 340 covers the light emitting element 110B and the conductive wires 372 and 371. As schematically shown in FIG. 36, the light-transmissive member 340 includes a plurality of concave portions 340d located, for example, two-dimensionally at a top surface 340a located above the top surface 110a of the light emitting element 110B. In this example, the top surface 340a of the light-transmissive member 340 is positionally aligned with a top surface 350a of the resin portion 350, and forms the top surface 100a of the light emitting device 100E together with the top surface 350a.

Figure 37:
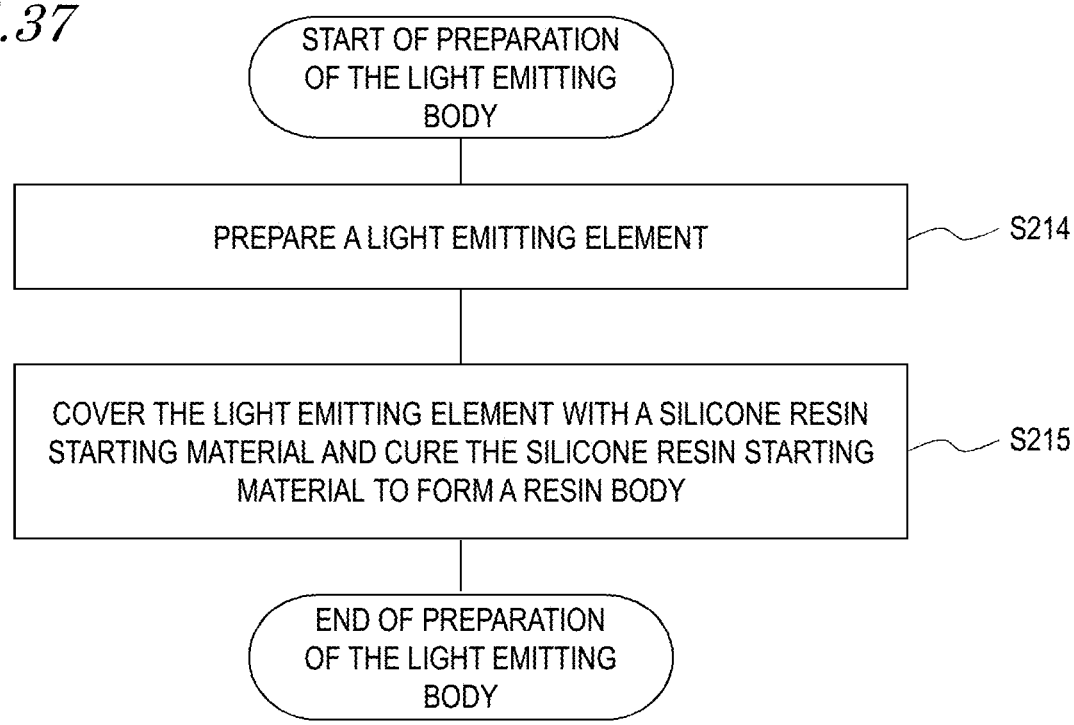
FIG. 37 is a flowchart showing another example of steps that may be included in step S21 shown in FIG. 8.

Hereinafter, an illustrative method for producing the light emitting device 100E will be described. The light emitting device 100E shown in FIG. 35 and FIG. 36 may be produced generally by substantially the same steps as shown in the flowchart of FIG. 8. In this example, however, as shown in FIG. 37, the step of preparing a light emitting body includes a step of preparing a light emitting element having a top surface (step S214) and a step of covering the light emitting element with a silicone resin starting material and curing the silicone resin starting material to form a resin body (step S215). The step of forming the light-transmissive member may be substantially the same as described above with reference to FIG. 9.

Figure 38:
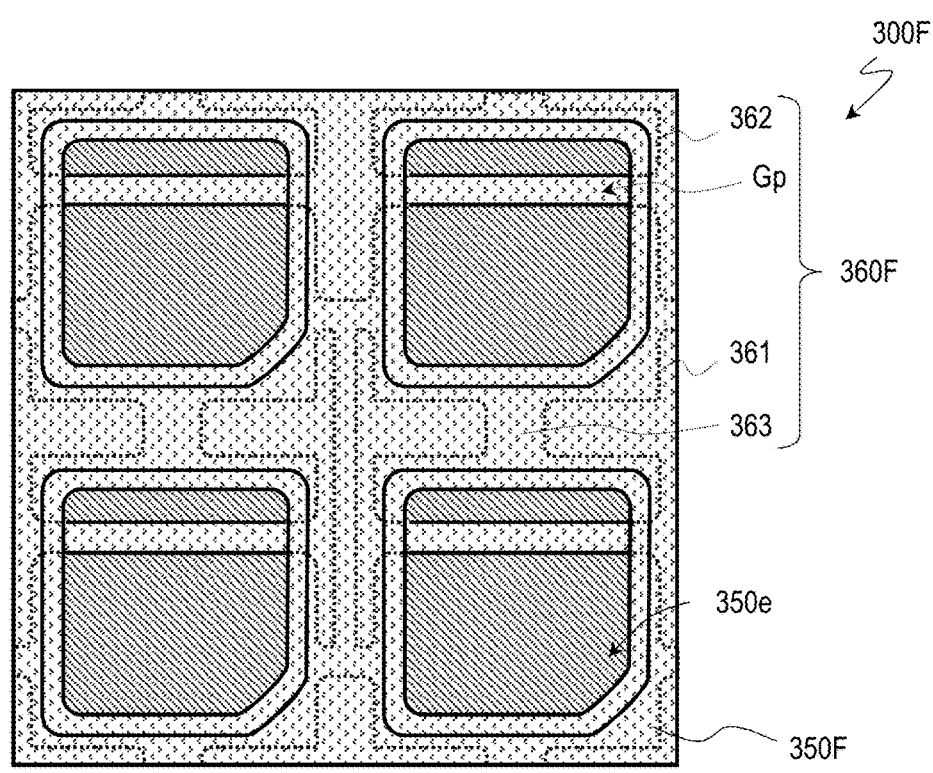
FIG. 38 is a schematic plan view showing an example of composite substrate.

The light emitting body is prepared as follows (step 21 in FIG. 8). First, the light emitting element 110B and the resin package 300 are prepared (step S214 in FIG. 37). The resin package 300 may be prepared in the form of a composite substrate including a plurality of units each forming the resin package 300. FIG. 38 shows an example of composite substrate. A composite substrate 300F shown in FIG. 38 includes a conductive lead frame 360F and a resin portion 350F including a plurality of the concave portions 350e. FIG. 38 shows four of the plurality of units each including one concave portion 350e.

As schematically shown in FIG. 38, the lead frame 360F includes a plurality of sets of conductive leads each including the conductive lead 361 as a first conductive member and the conductive lead 362 as a second conductive member, and a plurality of coupling portions 363 each located between, and connecting, two sets of the plurality of sets adjacent to each other. The conductive leads 361 and 362 may include, for example, a base plate formed of Cu and a metal layer covering the base plate. The metal layer covering the base plate is, for example, a plated layer containing Ag, Al, Ni, Pd, Rh, Au, Cu, an alloy thereof, or the like.

A part of the conductive lead 361 and a part of the conductive lead 362 are exposed at the bottom of each of the concave portion 350e of the resin portion 350F. Each set of the conductive lead 361 and the conductive lead 362 facing each other in the concave portion 350e has a gap Gp formed by the conductive lead 361 and the conductive lead 362 being spatially separated from each other. The gap Gp is filled with a material used to form the resin portion 350F.

The composite substrate 300F may be formed as follows. The resin portion 350F is formed by transfer molding or the like so as to be integral with the lead frame 350F. For example, the lead frame 360F is located in a cavity of a die, the cavity is filled with the third resin material, and the third resin material is cured to form the resin portion 350F. As a result, the composite substrate 300F is formed.

Figure 39:
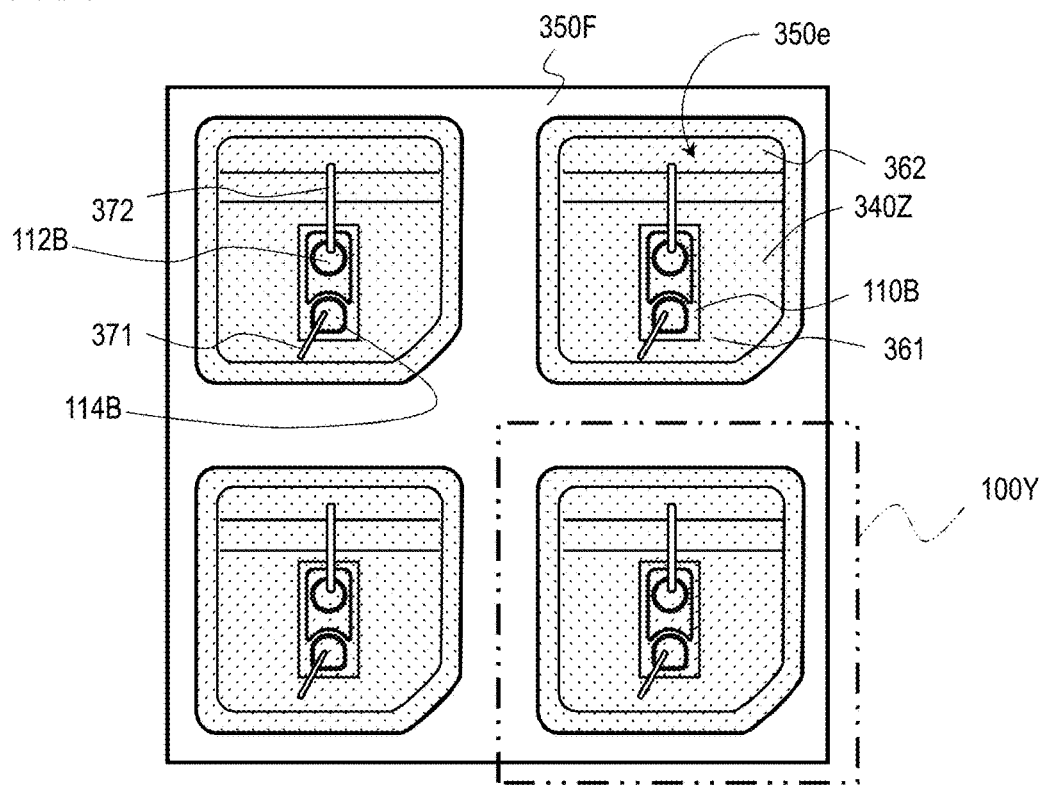
FIG. 39 is a schematic plan view showing a method for producing a light emitting device in Embodiment 3 according to the present disclosure.

Next, as shown in FIG. 39, the light emitting element 110B is located in each concave portion 350e, and the positive electrode 112B and the negative electrode 114B are respectively electrically connected with the conductive leads 362 and 361 via the conductive wires 372 and 371. In this example, the positive electrode 112B and the negative electrode 114B are respectively connected with the conductive leads 362 and 361. Alternatively, the positive electrode 112B may be connected with the conductive lead 361 and the negative electrode 114B may be connected with the conductive lead 362.

The concave portion 350e is filled with a silicone resin starting material containing an uncured silicone resin, and the silicone resin starting material is cured to form a light-transmissive resin body 340Z covering the light emitting element 110B (step S215 in FIG. 37). The silicone resin starting material used to form the resin body 340Z may be substantially the same as the material of the resin body 140X described above. Namely, the silicone resin in the resin body 340Z may contain an organic polysiloxane including at least one phenyl group in a molecule and/or an organic polysiloxane including a D unit, in which two methyl groups are bonded with a silicon atom. The silicone resin starting material may further have particles of a light-reflective filler dispersed therein.

As a result of the above-described steps, a structure including a plurality of light emitting bodies 100Y in a repeated manner is formed as shown in FIG. 39. The light emitting bodies 100Y each include the light emitting element 110B and the light-transmissive resin body 340Z. In this example, a concave and convex pattern is formed at the top surface of the resin body 340Z in substantially the same manner as in the example described above with reference to FIG. 18 and FIG. 19.

Figure 40:
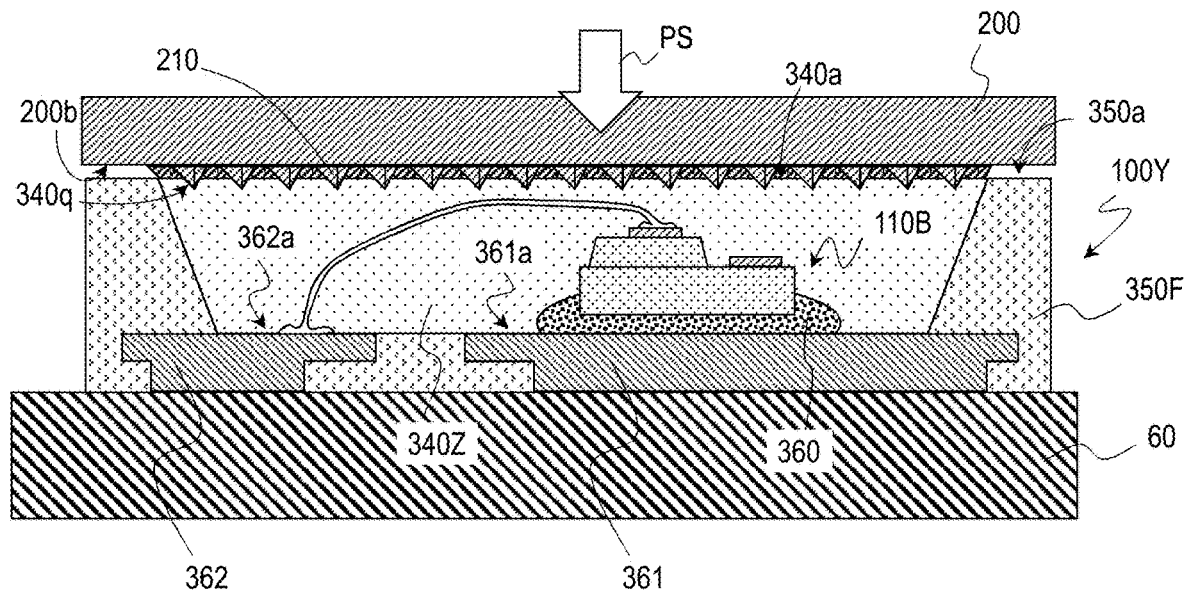
FIG. 40 is a schematic cross-sectional view showing the method for producing the light emitting device in Embodiment 3 according to the present disclosure.

For example, as schematically shown in FIG. 40, the light emitting body 100Y is located on the support body 60, and the die 200 is located such that the convex portions 210 thereof face the top surface 340a of the resin body 340Z. Then, for example, the ambient temperature is raised, and the die 200 is pressed onto the top surface 340a of the resin body 340Z in a heated state. As a result of the die 200 being pressed, a plurality of concave portions 340q are formed at the top surface 340a of the resin body 340Z (step 221 in FIG. 9). In this example, the concave portions 340q are selectively formed at the top surface 340a of the resin body 340Z. Alternatively, the concave portions 340q may also be formed at the top surface 350a of the resin portion 350F.

Figure 41:
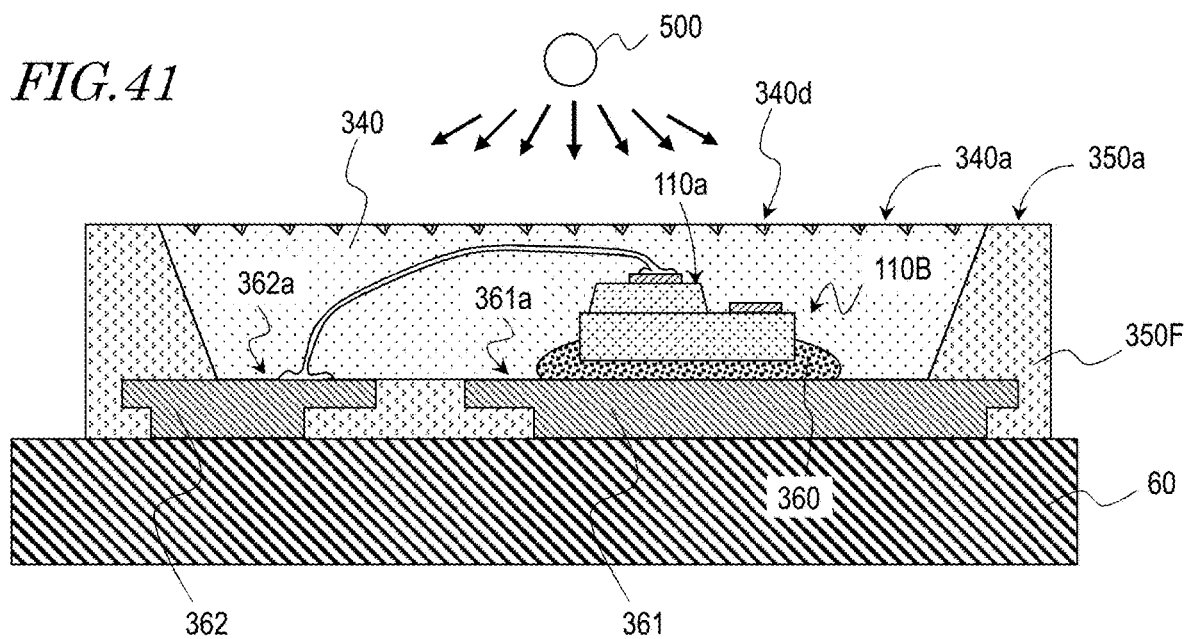
FIG. 41 is a schematic cross-sectional view showing the method for producing the light emitting device in Embodiment 3 according to the present disclosure.

Next, the top surface 340a of the resin body 340Z, at which the plurality of concave portions 340q are formed, is irradiated with ultraviolet rays by use of, for example, the ultraviolet ray irradiation device 500 (step S222 in FIG. 9). As schematically shown in FIG. 41, the light-transmissive member 340 covering the top surface 110a of the light emitting element 110B and including the plurality of concave portions 340d at the top surface 340a is formed of the resin body 340Z. Then, the resin portion 350F and the coupling portion 363 of the lead frame 360F are cut at position between two light emitting bodies 100Y adjacent to each other by a dicing saw or the like. As a result, a plurality of the light emitting devices 100E are produced.

Figure 42:
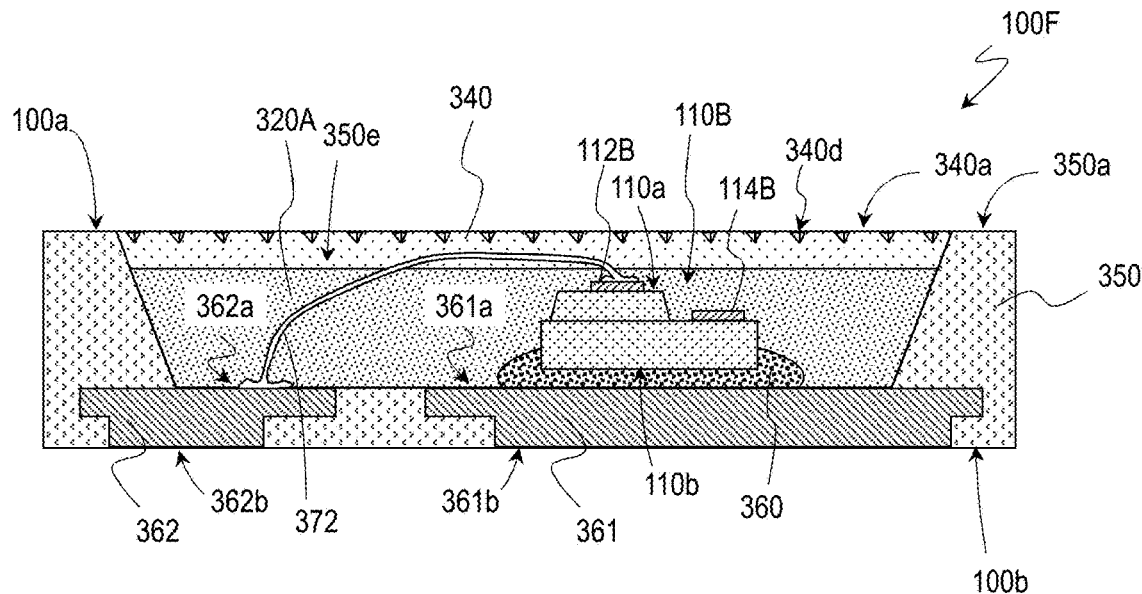
FIG. 42 is a cross-sectional view schematically showing a structure of another illustrative light emitting device produced by a production method in Embodiment 3 according to the present disclosure.

Before the resin body 340Z is formed, a wavelength converting member that covers the light emitting element 110B may be formed. For example, the second resin material is put inside each concave portion 350e to cover the light emitting element 110B and is cured to form a wavelength converting member 320A. Then, the resin body 340Z is formed on the wavelength converting member 320A. Then, the steps described above with reference to FIG. 40 and FIG. 41 are performed to produce a light emitting device 100F shown in FIG. 42.

The light emitting device 100F includes the wavelength converting member 320A covering the light emitting element 110B and the light-transmissive member 340 covering the wavelength converting member 320A both inside the concave portion 350e. The light-transmissive member 340 includes the plurality of concave portions 340d at the top surface 340a thereof.

Figure 43:
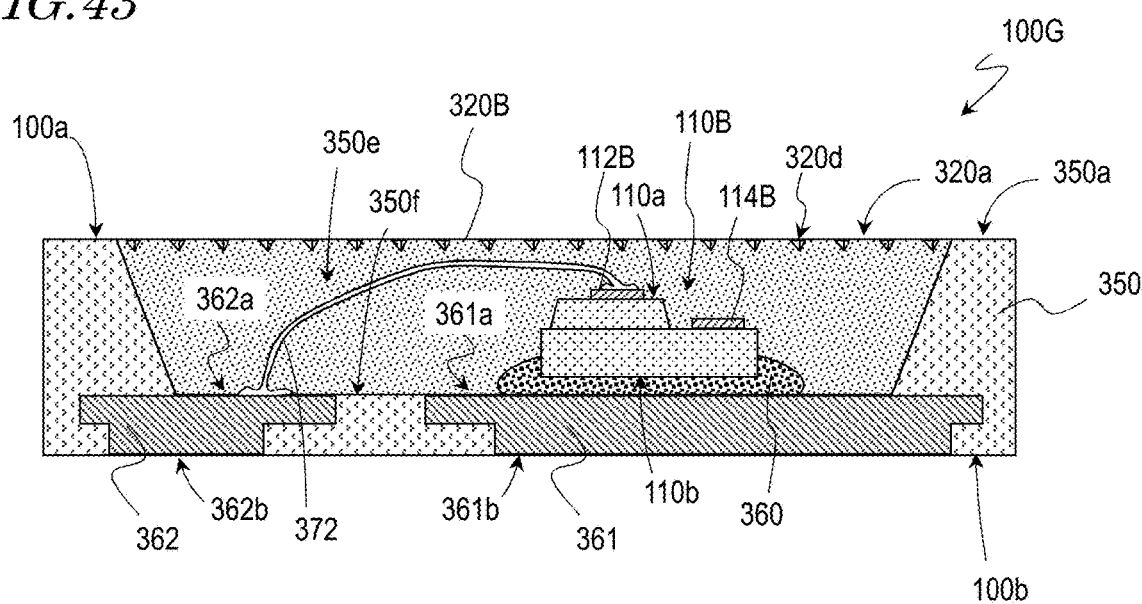
FIG. 43 is a cross-sectional view schematically showing a structure of still another illustrative light emitting device produced by a production method in Embodiment 3 according to the present disclosure.

Alternatively, the second resin material containing a silicone resin may be used as a silicone resin starting material to fill each concave portion 350e. The second resin material inside the concave portion 350e is cured to form a light emitting body, and substantially the same steps as described above with reference to FIG. 40 and FIG. 41 are performed. Thus, a light emitting device 100G shown in FIG. 43 is produced.

The light emitting device 100G includes a wavelength converting member 320B covering the light emitting element 110B inside the concave portion 350e. As schematically shown in FIG. 43, the wavelength converting member 320B includes a plurality of concave portions 320d at a top surface 320a thereof. As can be seen, the plurality of concave portions 320d may be formed at the wavelength converting member 320B as a light-transmissive member by pressing a die onto the wavelength converting member 320B and irradiating the wavelength converting member 320B with ultraviolet rays.

In Embodiment 3 according to the present disclosure, like in Embodiment 2, the surface of the light-transmissive resin body covering the light emitting element may be provided with a microscopic structure. This is expected to improve the light extraction efficiency. In Embodiment 3, after the light emitting element is encapsulated with a resin, a concave and convex pattern may be formed at the surface of the light-transmissive member covering the light emitting element. In this embodiment also, after the surface of the light-transmissive resin body is provided with a shape, the surface of the resin body is irradiated with ultraviolet rays. Therefore, even if a process performed at a high temperature such as reflow or the like is performed, the shape of concave and convex pattern at the surface of the light-transmissive member can be maintained.

EXAMPLES

Example 1

A sample of example 1 was produced in accordance with the following procedure. The shape of the surface of the sample of example 1 before the irradiation with the ultraviolet rays was compared against the shape after the irradiation with the ultraviolet rays.

First, a light-transmissive sheet formed by curing a silicone resin containing an organic polysiloxane including a phenyl group in a molecule was prepared. In this example, a silicone resin commercially available from Shin-Etsu Chemical Co., Ltd. (KE-1011) was formed into a resin sheet by screen printing. Then the resin sheet was heated at a temperature of 150° C. for 4 hours to cure the silicone resin to form a light-transmissive resin sheet having a thickness of 100 μm.

A die including a plurality of convex portions at a surface thereof was prepared. Each of the plurality of convex portions was equilateral triangular pyramid-shaped, and had a height of 1.3 μm from a surface of the die. The convex portions were arrayed two-dimensionally on the surface of the die, such that apexes of the convex portions were located at lattice points of a triangular lattice. The distance between the apexes of two convex portions adjacent each other was 3.5 μm.

Figure 44:
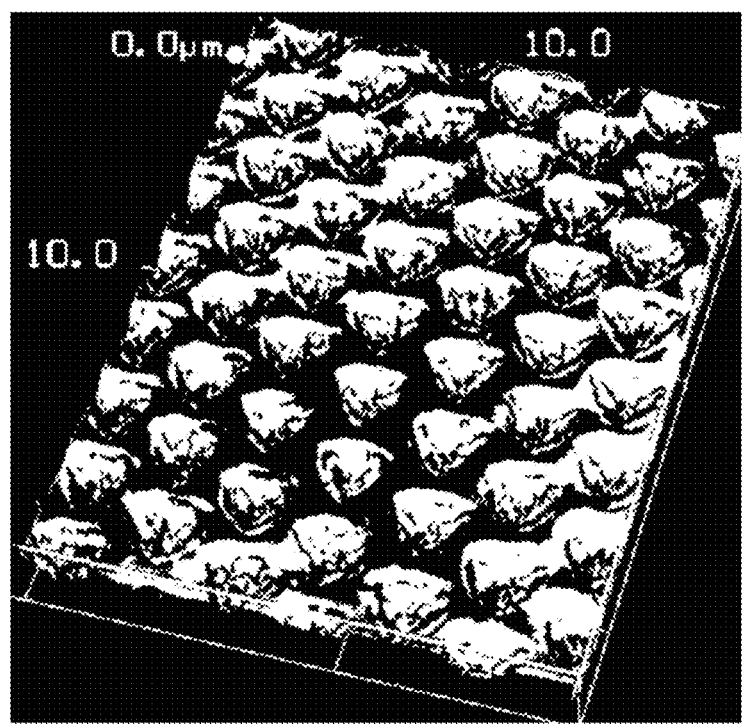
FIG. 44 shows a surface shape of a light-transmissive sheet obtained after a die is separated.
Figure 45:
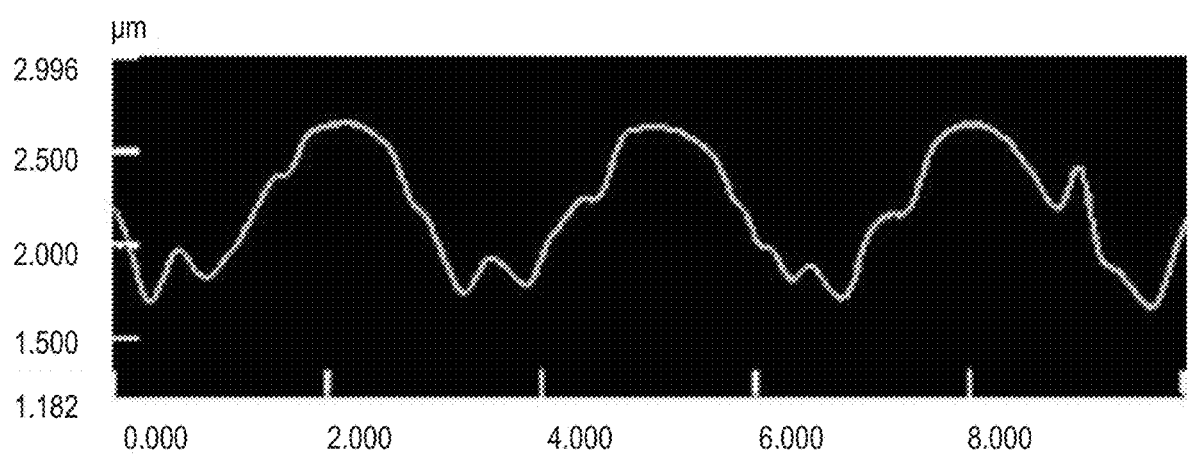
FIG. 45 shows a cross-sectional profile of the light-transmissive sheet obtained after the die is separated.

Next, one principal surface of the light-transmissive sheet and the surface of the die provided with the plurality of convex portions were located to face each other, and the die was pressed onto the principal surface of the light-transmissive sheet at a pressure of 3 MPa by use of a press with the heated platens in a state where the ambient temperature was raised to 150° C. Then, the die was separated from the light-transmissive sheet. After the die was separated, a plurality of concave portions were formed at the principal surface of the light-transmissive sheet, at positions corresponding to the plurality of convex portions. FIG. 44 and FIG. 45 are each an image, obtained by a laser microscope, showing the surface shape of the light-transmissive sheet after the die was separated. FIG. 45 shows a cross-sectional profile of the light-transmissive sheet. The depth of the concave portions formed at the surface of the light-transmissive sheet was in the range of about 1.1 to about 1.5 μm.

Next, the principal surface of the light-transmissive sheet, at which the plurality of concave portions were formed, was irradiated with ultraviolet rays by use of an ultraviolet ray irradiation device including an ultraviolet light source having a peak wavelength of 365 nm. The ultraviolet rays used had a spectrum expanding over a wavelength range of UVA to UVC. The amount of the ultraviolet rays used for the irradiation was 23 J/cm$^2$, and the irradiation time was about 50 seconds.

Figure 46:
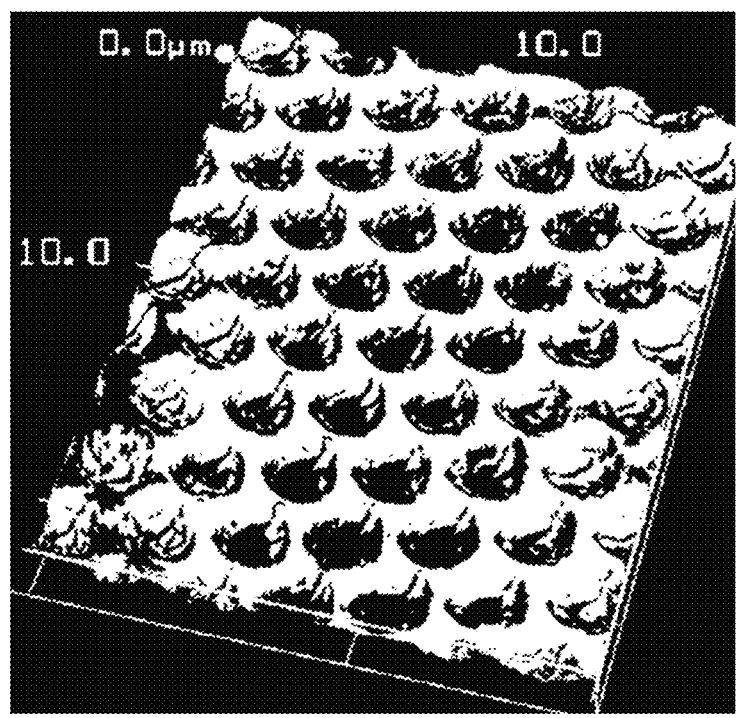
FIG. 46 shows a surface shape of a light-transmissive sheet after the sheet is irradiated with ultraviolet rays.
Figure 47:
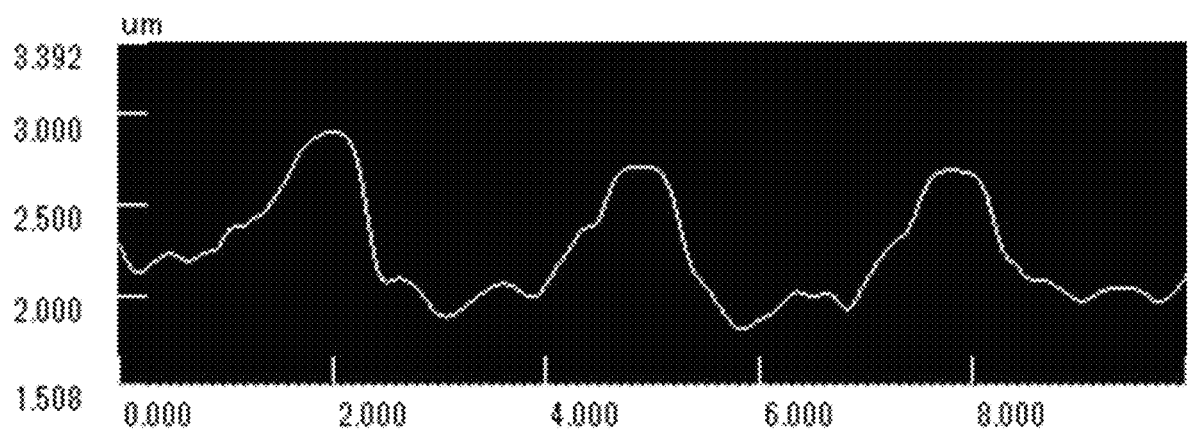
FIG. 47 shows a cross-sectional profile of the light-transmissive sheet after the sheet is irradiated with ultraviolet rays.

FIG. 46 and FIG. 47 each show a surface shape of the light-transmissive sheet after the irradiation with the ultraviolet rays. Like FIG. 45, FIG. 47 shows a cross-sectional profile of the light-transmissive sheet. The depth of the concave portions at the surface of the light-transmissive sheet after the irradiation with the ultraviolet rays was in the range of about 1.0 to about 1.4 μm. No significant depth change was observed after the irradiation with the ultraviolet rays. However, it was found from a comparison between FIG. 45 and FIG. 47, the regions between the convex portions were made slightly acute as a result of the irradiation with the ultraviolet rays.

Example 2

A sample of example 2 was produced in substantially the same manner as the sample of example 1 except that a die having a different shape of convex portions in a different positional arrangement was used. The convex portions of the die used to produce the sample of example 2 were conical, and the height thereof was 1.5 μm. The convex portions were arrayed two-dimensionally on the surface of the die, such that apexes of the convex portions were located at lattice points of a triangular lattice. The distance between the apexes of two convex portions adjacent each other was 3 μm.

Figure 48:
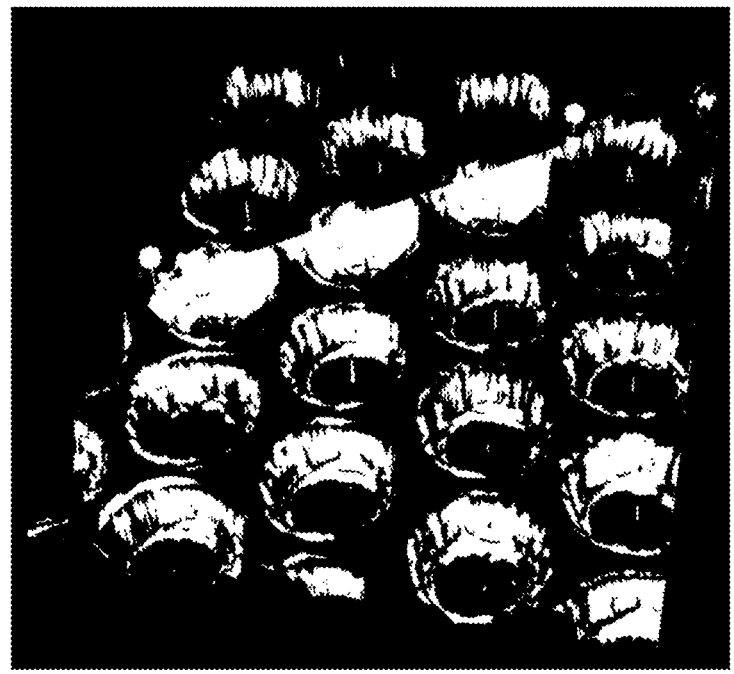
FIG. 48 shows a surface shape of a sample of example 2 after the sample is irradiated with ultraviolet rays.
Figure 49:
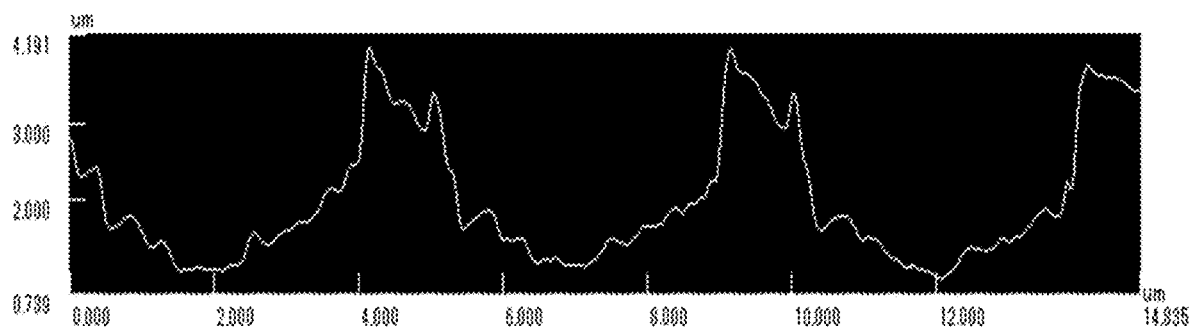
FIG. 49 shows a cross-sectional profile of the sample of example 2 after the sample is irradiated with ultraviolet rays.

FIG. 48 and FIG. 49 each show a surface shape of the light-transmissive sheet after the irradiation with the ultraviolet rays. Like FIG. 45 and FIG. 47, FIG. 49 shows a cross-sectional profile of the light-transmissive sheet. In the region shown in FIG. 49, the maximum value of the depth of the concave portions at the surface of the light-transmissive sheet after the irradiation with the ultraviolet rays was about 2.8 µm. As can be seen from FIG. 49, the surface of each concave portion and the regions of the surface between the concave portions are rough with microscopic convex portions having a height of about 0.5 µm. This is presumed to have been caused by an influence of pressing the die onto the surface of the light-transmissive sheet formed of a cured silicone resin and then drawing the convex portions of the die from the surface of the light-transmissive sheet.

Example 3, Comparative Example 1

Next, a sample of example 3 and a sample of comparative example 1 were produced by the following procedure in order to investigate the influence of heat on the shape of the sample.

First, a silicone resin commercially available from Shin-Etsu Chemical Co., Ltd. (LPS-3541) was formed into a sheet by screen printing, and was heated at a temperature of 150° C. for 4 hours to form a resin sheet having a thickness of 150 µm. LPS-3541 contains an organic polysiloxane including a phenyl group in a molecule, like KE-1011.

Figure 50:
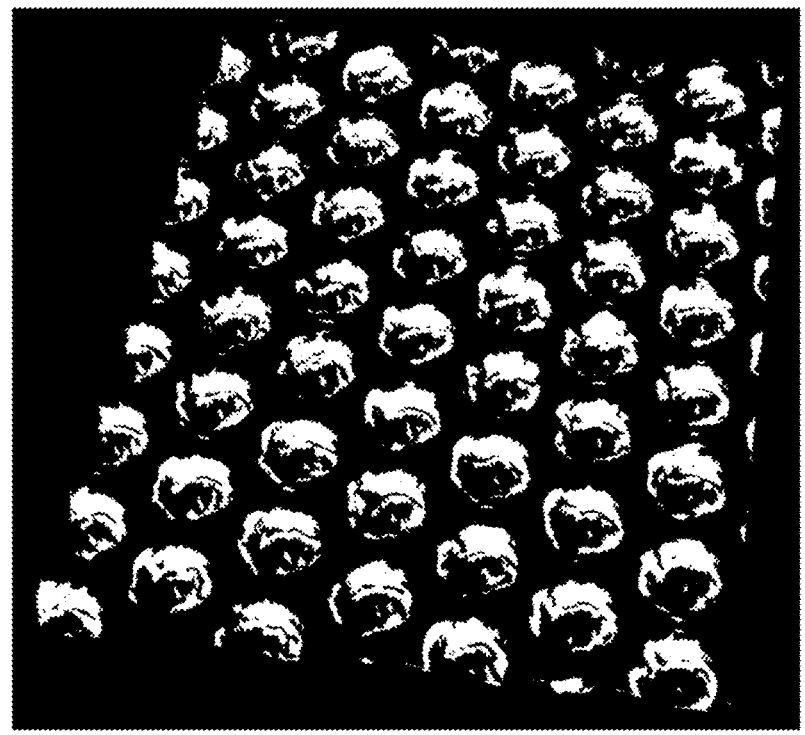
FIG. 50 shows a surface shape of a resin body obtained after a die is separated.

Next, a die having a plurality of convex portions at a surface thereof was prepared. One principal surface of the resin sheet and the surface of the die provided with the convex portions were located to face each other, and the die was pressed onto the principal surface of the resin sheet at a pressure of 5 MPa by use of a heat press device in a state where the ambient temperature was raised to 300° C. Then, the die was separated from the resin sheet. The convex portions of the die used in this example were conical and were arrayed two-dimensionally like in the sample of example 2. FIG. 50 shows a surface shape of the resin sheet after the die was separated. The depth of the concave portions formed at the surface of the resin sheet was in the range of about 0.9 to about 1.1 µm.

Next, the resin sheet was cut into two sheets. Regarding one of the two sheets, the surface provided with the concave portions was irradiated with ultraviolet rays by use of the ultraviolet ray irradiation device used in example 1, with an irradiation amount of 22.4 J/cm$^2$ for an irradiation time of about 30 seconds. The other sheet was not irradiated with ultraviolet rays after the die was pressed to form the concave portions.

The two sheets were placed in an electric furnace, and kept at a temperature of 300° C. for 40 minutes. Then, the two sheets were removed, and were cooled down to room temperature by natural air. Among the two sheets, the sheet irradiated with the ultraviolet rays by use of the ultraviolet ray irradiation device was labeled as the sample of example 3, and the sheet not irradiated with the ultraviolet rays by use of the ultraviolet ray irradiation device was labeled as the sample of comparative example 1.

Figure 51:
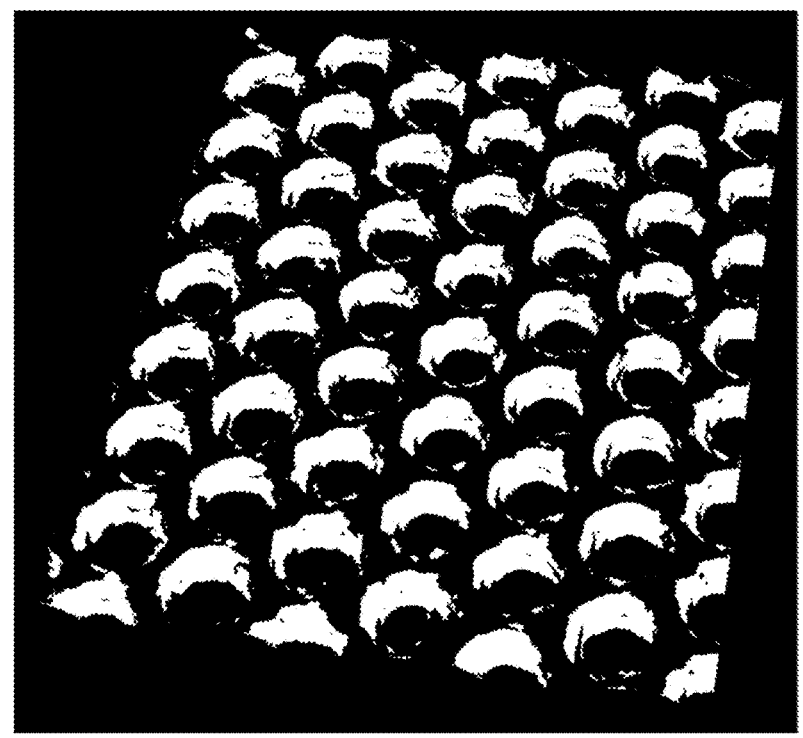
FIG. 51 shows a surface shape of a sample of example 3.

FIG. 51 shows a surface shape of the sample of example 3. It was found from a comparison between FIG. 50 and FIG. 51 that in the case where the surface, provided with the concave portions as a result of the die being pressed, was irradiated with the ultraviolet rays, the shape of the concave portions was maintained even after being heated at about 300° C. The depth of the concave portions formed at the surface of the sample of example 3 was in the range of about 0.9 to about 1.1 µm. In other words, the change in the depth was about 25% or lower after the heating.

Figure 52:
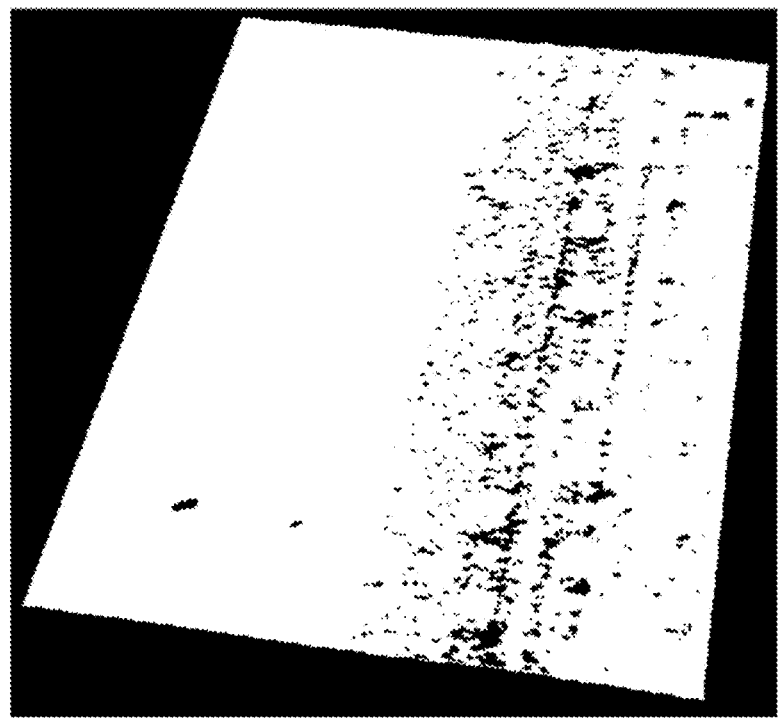
FIG. 52 shows a surface shape of a sample of comparative example 1.

FIG. 52 shows a surface shape of the sample of comparative example 1. It was found from FIG. 52 that in the case where the irradiation with the ultraviolet rays was not performed, the concave portions formed at the surface by the die being pressed were mostly lost after being heated. The depth of the concave portions left at the surface of the sample of comparative example 1 was merely 0.03 µm.

Reference Example 1

As is clear from a comparison between FIG. 51 and FIG. 52, with the process by which the surface of the resin sheet provided with the concave portions by the die being pressed is irradiated with ultraviolet rays of an amount of about 20 J/cm$^2$ or greater, the shape of the concave portions is maintained even if the resin sheet is exposed to a high temperature (e.g., glass transition temperature or higher). This is presumed to be caused by a change occurring at the surface or in the vicinity thereof irradiated with the ultraviolet rays.

A sample of reference example 1 was produced, in which a resin sheet was partially irradiated with ultraviolet rays. A spectrum comparison was performed between a portion irradiated with the ultraviolet rays and a portion not irradiated with the ultraviolet rays by infrared spectroscopy. The sample of reference example 1 was produced as follows. Silicone resin LPS-3541 was preliminarily cured to form a light-transmissive sheet having a thickness of 150 µm, and a part of a surface of the light-transmissive sheet was irradiated with ultraviolet rays. Then, the silicone resin in the light-transmissive sheet was cured.

Figure 53:
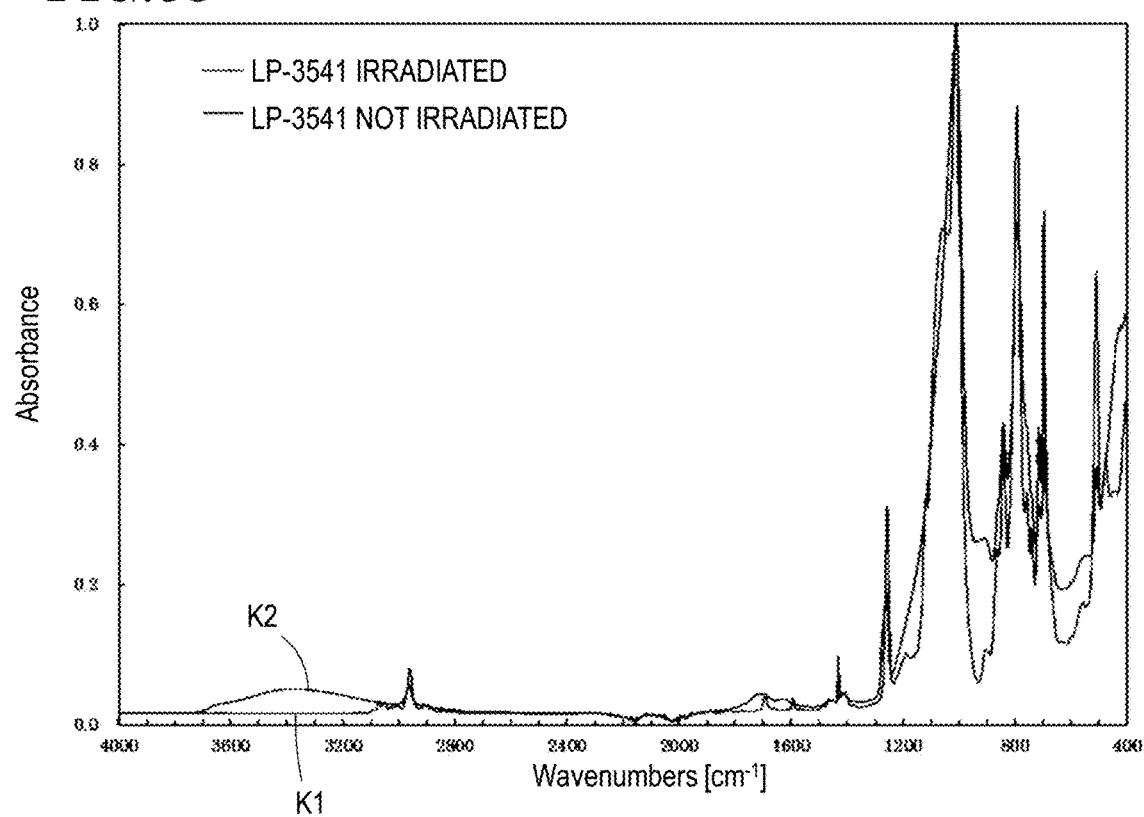
FIG. 53 shows infrared spectra of transmitted light regarding a sample of reference example 1 obtained by use of a Fourier-transform infrared spectrometer.
Figure 54:
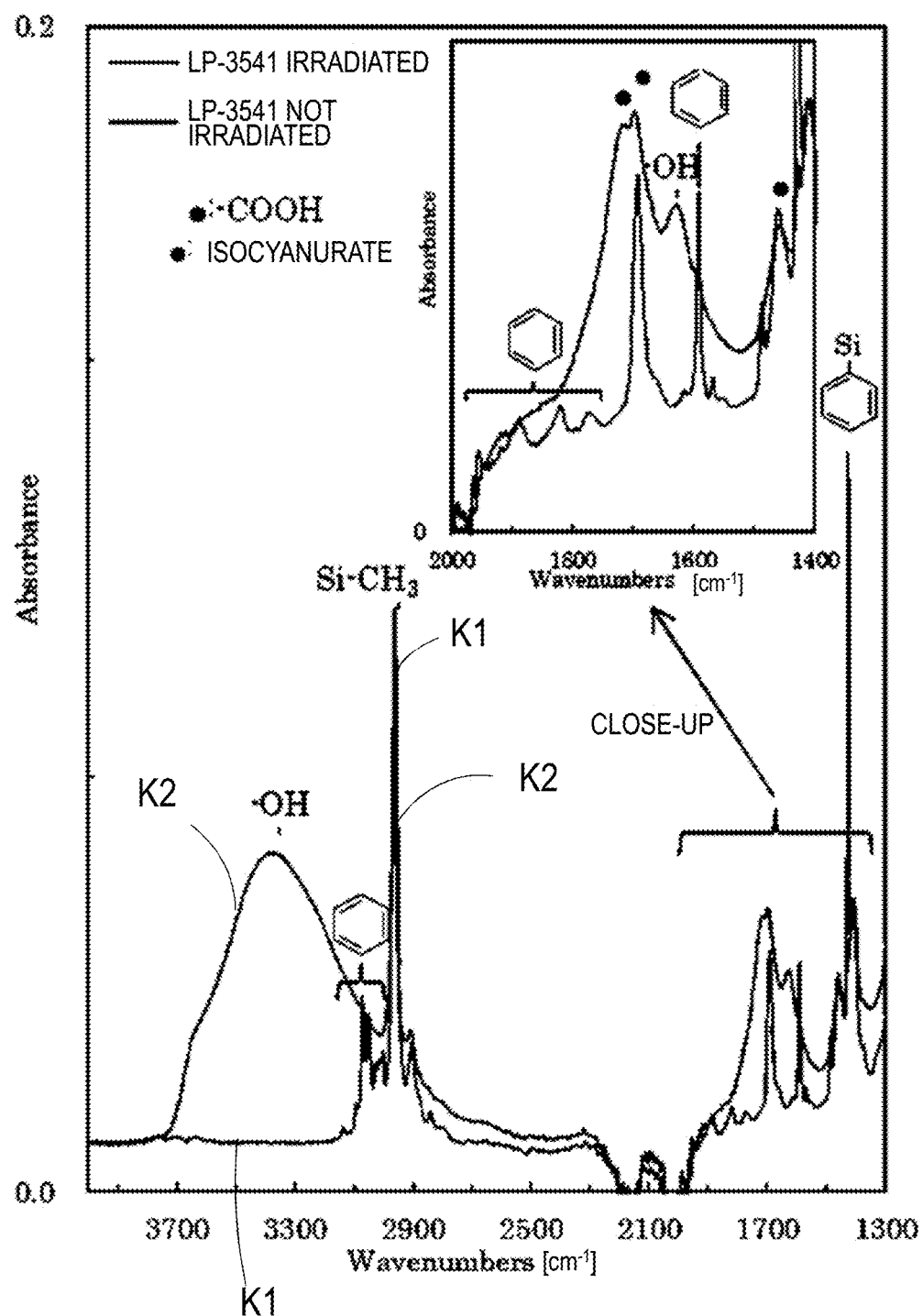
FIG. 54 shows a part of FIG. 53 in enlargement, more specifically, infrared spectra of transmitted light regarding the sample of reference example 1.
Figure 55:
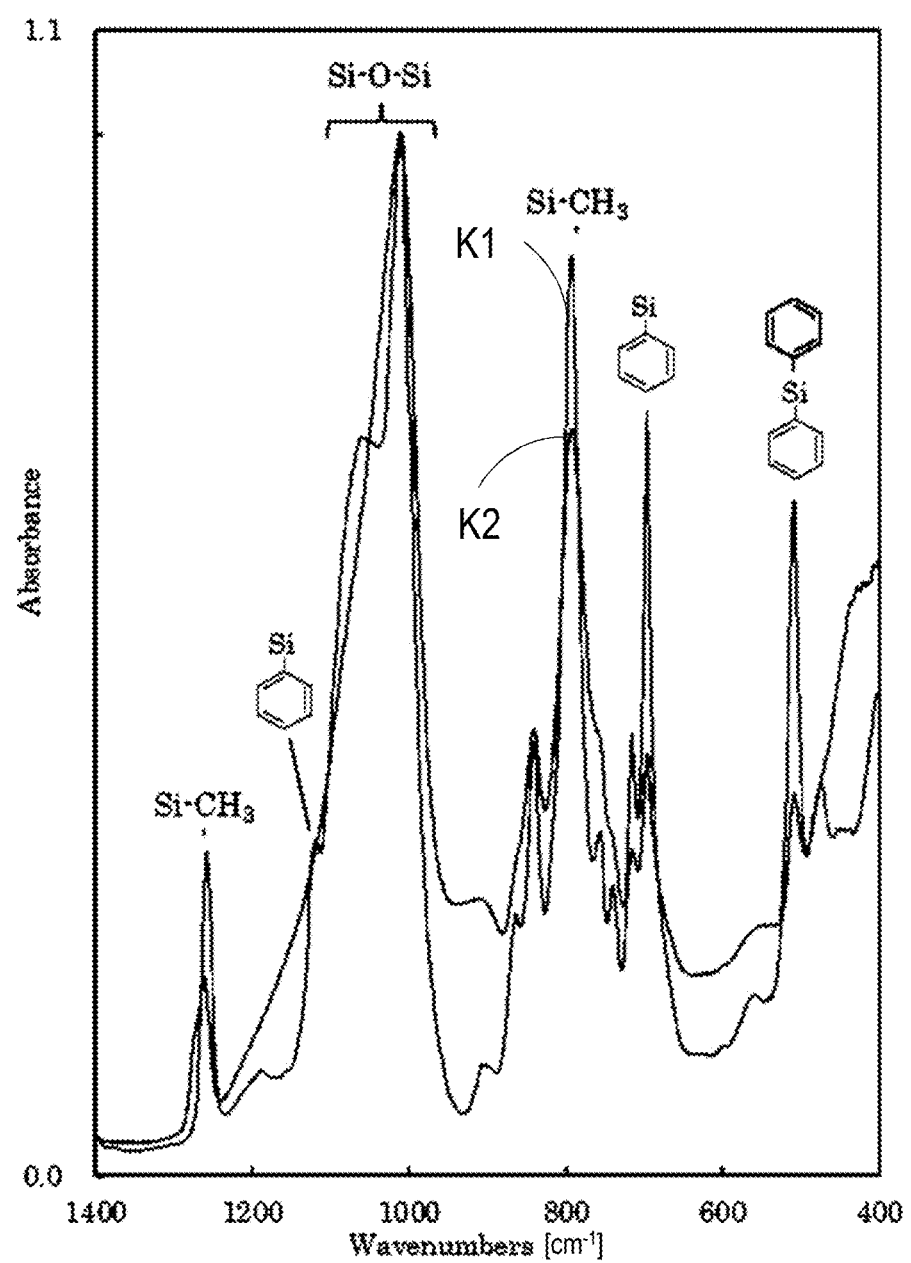
FIG. 55 shows a part of FIG. 53 in enlargement, more specifically, infrared spectra of transmitted light regarding the sample of reference example 1.

FIG. 53 through FIG. 55 each show infrared spectra of transmitted light in the sample of reference example 1, obtained by use of a Fourier-transform infrared (FT-IR) spectrometer. In FIG. 53 through FIG. 55, curve K1 represents a spectrum in the portion for which the intentional irradiation with the ultraviolet rays was avoided. Curve K2 represents a spectrum in the portion irradiated with the ultraviolet rays intentionally. In this example, a Nicolet iS50 module commercially available from Thermo Fisher Scientific K.K. was used to obtain the infrared spectra.

Now, FIG. 54 will be referred to. FIG. 54 shows, in enlargement, the spectra in the wave number range of 4000 to 1300 cm$^{-1}$ in the spectra of FIG. 53. FIG. 54 also shows, in further enlargement, the spectra in the wave number range of 2000 to 1400 cm$^{-1}$. In the spectra shown in FIG. 54, the wave number range of 3700 to 3000 cm$^{-1}$, which relates to absorption derived from Si—OH, is now paid attention to. As can be seen, an absorption peak appears at a wave number of 3400 cm$^{-1}$ or in the vicinity thereof as a result of the irradiation with the ultraviolet rays, and the absorption in the wave number range of 3700 to 3000 cm$^{-1}$ is increased.

FIG. 55 will be referred to. FIG. 55 shows, in enlargement, the spectra in the wave number range of 1400 to 400 cm$^{-1}$ in the spectra of FIG. 53. An absorption peak at a wave number of 2960 cm$^{-1}$ or the vicinity thereof and an absorption peak at a wave number of 800 cm$^{-1}$ or in the vicinity thereof, which relate to absorption derived from Si—CH$_3$, are now paid attention. As can be seen from FIG. 54 and FIG. 55, these peaks are lowered as a result of the irradiation with the ultraviolet rays. Namely, in a light emitting device in an embodiment according to the present disclosure, the absorption of infrared by the light-transmissive member is basically larger in the wave number range greater than 3700 cm$^{-1}$ and less than 3000 cm$^{-1}$ and is smaller at a wave number of 2960 cm$^{-1}$ and in the vicinity thereof and at a wave number of 800 cm$^{-1}$ and in the vicinity thereof, as compared with the absorption of infrared by the silicone resin for which the intentional irradiation with the ultraviolet rays of an amount of 20 J/cm² or greater is avoided. Based on this, it is presumed that a change occurs to a very shallow region of the surface of the light-transmissive sheet irradiated with the ultraviolet rays to increase the hardness of a part of the light-transmissive sheet, and as a result, the shape of the concave portions is suppressed from being changed due to the high temperature.

Next, a plurality of samples different in the irradiation amount with ultraviolet rays were produced, and an influence of the irradiation with ultraviolet rays on the tacky property of the surface of the samples was investigated. In this specification, the term "tackiness" is used as not being distinguished from the term "tacky property", and these terms are used as having the same meaning. In this specification, the "tacky property" and the "tackiness" refer to a value obtained by a measurement performed by use of a probe method described below.

First, a resin block having a thickness of 3 mm is formed, and one resin block is cut to prepare a plurality of resin block test pieces having a diameter of 16 mm. A probe is put into contact with a surface of each of these resin blocks by use of a 5966 Dual Column Tabletop Model testing system commercially available from Instron Japan Co. Ltd. Then, the probe is moved at a constant rate, and a force required to separate the probe from the surface of each of the resin blocks is measured. For the measurement, a stainless steel probe including a planar tip and a tip area size of 1800 mm² is used. The time of contact of the probe with the surface of the resin block is 1 second, and the jog speed of the probe is 9 ram/min. The average of the measurement values obtained for three resin block test pieces prepared as a result of cutting one sheet is set as the measurement value of the tackiness.

Reference Example 2

Samples of reference example 2 were produced by the following procedure. Silicone LPS-3541 produced by Shin-Etsu Chemical Co., Ltd. was formed into a sheet by screen printing, and was heated at a temperature of 150° C. for 4 hours to form a resin sheet having a thickness of 150 µm in substantially the same manner as in example 3. In this example, the die was not pressed and thus the resin sheet was not provided with any shape. The resin sheet was cut into a plurality of resin sheet pieces. Among these resin sheet pieces, three resin sheet pieces were extracted randomly. One principal surface of each of the three resin sheet pieces was irradiated with ultraviolet rays of an amount of 240 J/cm² for an irradiation time of about seconds, like the sample of example 3. After being irradiated with the ultraviolet rays, the resin sheet pieces were located in an electric furnace and kept at a temperature of 300° C. for 40 minutes. Then, the resin sheet pieces was removed from the electric furnace and cooled down to room temperature by natural air. The resultant resin sheet pieces were set as the samples of reference example 2.

Reference Example 3

Samples of reference example 3 were produced in substantially the same manner as the sample of reference example 2 except that the irradiation amount of the ultraviolet rays was 22.4 J/cm².

Comparative Example 2

Samples of reference comparative example 3 were produced in substantially the same manner as the sample of reference example 2 except that the irradiation with the ultraviolet rays was not performed.

Figure 56:
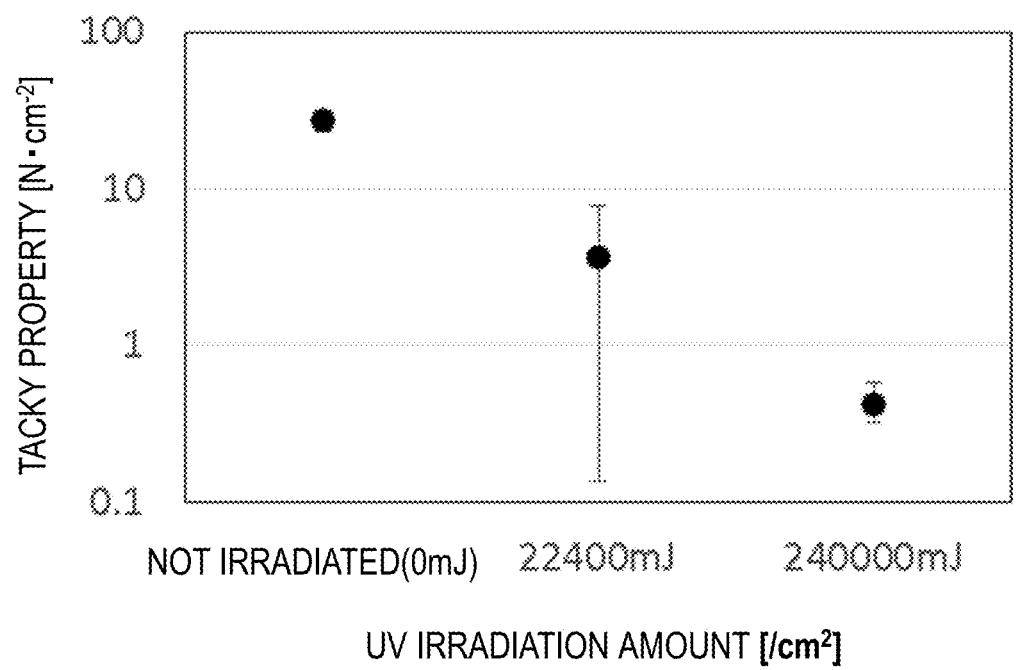
FIG. 56 shows measurement results on tacky property of surfaces of samples of reference example 2, reference example 3 and comparative example 2.

FIG. 56 shows measurement results on the tackiness of the surface of each of the samples of reference example 2, reference example 3 and comparative example 2. In FIG. 56, the right plot shows the measurement value of the samples of reference example 2, the central plot shows the measurement value of the samples of reference example 3, and the left plot shows the measurement value of the samples of comparative example 2.

As shown in FIG. 56, the measurement value of tackiness of the surface of the samples of comparative example 2 was approximately in the range of 23 to 32 N·cm⁻². The samples of reference example 3, irradiated with the ultraviolet rays of the amount of 22.4 J/cm², exhibited a measurement value of tackiness of about 0.1 to about 8 N·cm⁻². The samples of reference example 2, irradiated with the ultraviolet rays of the amount of 240 J/cm², exhibited a measurement value of tackiness of about 0.3 to about 0.6 N·cm⁻². Based on this, it is presumed that some change occurred to the surface and/or the vicinity of the surface of the resin sheet formed of a silicone resin as a result the intentional irradiation with the ultraviolet rays. It is presumed that the tackiness of the surface of the resin was decreased by the intentional irradiation with the ultraviolet rays. Based on the results shown in FIG. 56, it has been found that, for example, the tacky property of the surface of a resin body containing a silicone resin, when being irradiated with ultraviolet rays of an amount of about 20 J/cm² or greater, may be decreased to, for example, 50% of lower of the tacky property of the surface of a silicone resin for which the intentional irradiation with the ultraviolet rays was avoided.

An embodiment according to the present disclosure is applicable to produce an optical element that is, for example, located on or above a front surface of a light source and transmits at least a part of incident light. An embodiment according to the present disclosure is especially useful for producing a light emitting device including a light-transmissive member covering a light emitting element such as an LED or the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device comprising:
   a light emitting element having a top surface; and
   a light-transmissive member covering at least the top surface of the light emitting element, the light-transmissive member having a principal surface located above the top surface of the light emitting element;
   wherein:
   the principal surface of the light-transmissive member comprises a plurality of concave portions;
   an absorption, corresponding to Si—OH, appearing in an absorption spectrum by the light-transmissive member, in a wave number range greater than 3700 cm⁻¹ and less than 3000 cm⁻¹, is larger than an absorption appearing in an absorption spectrum by a silicone resin, in the wave number range greater than 3700 cm⁻¹ and less than 3000 cm⁻¹; and
   absorption peaks, corresponding to Si—CH₃, appearing in the absorption spectrum by the light-transmissive member, at a wave number of 2960 cm$^{-1}$ or in a vicinity thereof and at a wave number of 800 cm$^{-1}$ or in a vicinity thereof, are respectively lower than absorption peaks appearing in the absorption spectrum by the silicone resin, at the wave number of 2960 cm$^1$ or in the vicinity thereof and at the wave number of 800 cm$^{-1}$ or in the vicinity thereof, the absorption spectra being obtained by infrared spectroscopy.

2. The light emitting device of claim 1, wherein the plurality of concave portions have a depth of 0.9 μm or greater.

3. The light emitting device of claim 1, wherein:
the light-transmissive member contains a silicone resin; and
the silicone resin contains an organic polysiloxane including at least one phenyl group in a molecule.

4. The light emitting device of claim 1, wherein:
the light-transmissive member contains a silicone resin; and
the silicone resin contains an organic polysiloxane including a D unit, in which two methyl groups are bonded to a silicon atom.

5. A light emitting device comprising:
a light emitting element having a top surface; and
a light-transmissive member covering at least the top surface of the light emitting element, and having a top surface located above the top surface of the light emitting element; wherein:
the light-transmissive member contains a silicone resin;
the top surface of the light-transmissive member comprises a plurality of concave portions; and
a tackiness of the top surface of the light-transmissive member is in a range of 0.1 N·cm$^{-2}$ to 8 N·cm$^{-2}$.

6. The light emitting device of claim 5, wherein the plurality of concave portions have a depth of 0.9 μm or greater.

7. The light emitting device of claim 5, wherein the silicone resin contains an organic polysiloxane including at least one phenyl group in a molecule.

8. The light emitting device of claim 5, wherein the silicone resin contains an organic polysiloxane including a D unit, in which two methyl groups are bonded to a silicon atom.

* * * * *